(12) United States Patent
Kress et al.

(10) Patent No.: US 12,425,013 B1
(45) Date of Patent: Sep. 23, 2025

(54) IMPLEMENTING OPTIMAL COARSE PROGRAMMABLE DELAY SETTING IN SKEW ADJUST CLOSED LOOP CONTROL

(71) Applicant: International Business Machines Corporation, Armonk, NY (US)

(72) Inventors: Jan Philipp Kress, Boeblingen (DE); Andreas H. A. Arp, Nufringen (DE); Michael Guenther, Ulm (DE)

(73) Assignee: International Business Machines Corporation, Armonk, NY (US)

( * ) Notice: Subject to any disclaimer, the term of this patent is extended or adjusted under 35 U.S.C. 154(b) by 50 days.

(21) Appl. No.: 18/612,496

(22) Filed: Mar. 21, 2024

(51) Int. Cl.
| | |
|---|---|
| *H03K 5/14* | (2014.01) |
| *G06F 1/10* | (2006.01) |
| *G06F 1/12* | (2006.01) |
| *H03K 5/00* | (2006.01) |

(52) U.S. Cl.
CPC ............... *H03K 5/14* (2013.01); *G06F 1/10* (2013.01); *G06F 1/12* (2013.01); *H03K 2005/00019* (2013.01)

(58) Field of Classification Search
CPC .. H03K 5/14; H03K 2005/00019; G06F 1/10; G06F 1/12
USPC ........................................................ 327/153
See application file for complete search history.

(56) References Cited

U.S. PATENT DOCUMENTS

| | | | | |
|---|---|---|---|---|
| 6,259,330 B1 * | 7/2001 | Arai | ...................... | H03L 7/0997 331/177 R |
| 6,671,652 B2 * | 12/2003 | Watson, Jr. | ...... | G01R 31/31725 702/177 |
| 7,952,404 B2 * | 5/2011 | Petrie | ...................... | H03L 7/07 327/158 |
| 7,971,088 B2 * | 6/2011 | Jung | ..................... | H03K 5/133 713/401 |
| 10,110,205 B2 | 10/2018 | Arp et al. | | |
| 10,158,351 B1 * | 12/2018 | Arp | ........................ | H03K 5/131 |
| 10,348,278 B2 * | 7/2019 | Arp | ........................ | H03K 5/05 |
| 10,564,664 B2 * | 2/2020 | Arp | .................. | H03K 19/00323 |
| 10,784,871 B1 * | 9/2020 | Xanthopoulos | ....... | H03L 7/0812 |
| 11,545,981 B1 * | 1/2023 | Xanthopoulos | ........... | G06F 1/10 |
| 11,775,004 B2 | 10/2023 | Malone et al. | | |
| 2008/0115004 A1 * | 5/2008 | Braun | ...................... | G06F 1/10 713/401 |
| 2008/0204103 A1 * | 8/2008 | Jung | ..................... | H03K 5/133 327/261 |
| 2015/0323958 A1 * | 11/2015 | Arabi | ...................... | H03L 7/07 327/270 |
| 2016/0079971 A1 * | 3/2016 | Singh | ................... | G11C 29/028 327/276 |
| 2017/0214514 A1 | 7/2017 | Manohar et al. | | |
| 2018/0331676 A1 * | 11/2018 | Arp | ........................ | G06F 1/10 |
| 2019/0081630 A1 | 3/2019 | Li et al. | | |
| 2019/0103860 A1 * | 4/2019 | Arp | .................... | H03K 5/15006 |
| 2019/0103861 A1 * | 4/2019 | Arp | .................... | H03K 5/15006 |

(Continued)

*Primary Examiner* — Ryan Jager
(74) *Attorney, Agent, or Firm* — Patterson + Sheridan, LLP

(57) ABSTRACT

Embodiments of the present disclosure describe techniques for implementing enhanced skew control for synchronizing two clock meshes in an IC or chip. A disclosed skew adjust control, methods, and systems enable effective and efficient operations to optimize a coarse delay setting to maintain for a functional mode of operation of the system, where only fine delay steps are applied to an adjustable one of the clock meshes, based on measured clock skew, to synchronize the clock meshes.

20 Claims, 19 Drawing Sheets

(56) References Cited

U.S. PATENT DOCUMENTS

| | | | |
|---|---|---|---|
| 2019/0280680 A1* | 9/2019 | Arp | G06F 1/04 |
| 2020/0042033 A1 | 2/2020 | Bourgeault | |
| 2021/0239755 A1* | 8/2021 | Arp | G06F 1/10 |
| 2023/0085155 A1 | 3/2023 | Malone et al. | |
| 2023/0317127 A1* | 10/2023 | Schmidt | G06F 1/10 |

* cited by examiner

IMPLEMENTING OPTIMAL COARSE PROGRAMMABLE DELAY SETTING IN SKEW ADJUST CLOSED LOOP CONTROL

BACKGROUND

The present invention relates to the field of integrated circuits (ICs), and more specifically, to methods and systems for synchronizing or adjusting clock skew between two clock meshes in an IC or a chip computing system to enable correct chip operation.

Clock skew is a time difference between a first clock signal of a first clock mesh and a second clock signal of a second clock mesh. In various IC chips and systems, effectively synchronizing clock skew between at least some clock meshes is required to avoid operational failure. A need exists for new systems and techniques for adjusting skew between two or more clock meshes to both efficiently and effectively synchronize clock signals.

SUMMARY

Embodiments of the present disclosure are directed to an enhanced skew adjust control, methods, and systems for implementing an optimal coarse delay setting in an skew adjust control to synchronize skew between two clock meshes.

According to one embodiment of the present disclosure, a non-limiting computer implemented method is provided. The method comprises iteratively measuring a clock skew between a first clock mesh and a second clock mesh of a system; sequentially applying a programmable delay, based on the measured clock skew, to an adjustable one of the first clock mesh and the second clock mesh, where the respective programmable delays comprise one of a coarse delay step or a set of fine delay steps to compensate for the measured clock skew. The method comprises identifying, based on the programmable delays, a coarse delay setting from a plurality of the coarse delay settings that has a midpoint fine delay step of the set of fine delay steps closest to a synchronization point; and maintaining the coarse delay setting for a functional mode of operation of the system.

A disclosed method further comprises, during the functional mode, repeatedly measuring the clock skew between the first clock mesh and the second clock mesh; and applying a programmable delay comprising only fine delay steps, based on the measured clock skew, to compensate for the measured clock skew.

Other disclosed embodiments include a computer system and a skew adjust closed-loop control for synchronizing skew between a first clock mesh and a second clock mesh, implementing features of the above-disclosed methods.

DETAILED DESCRIPTION

Figure 1:
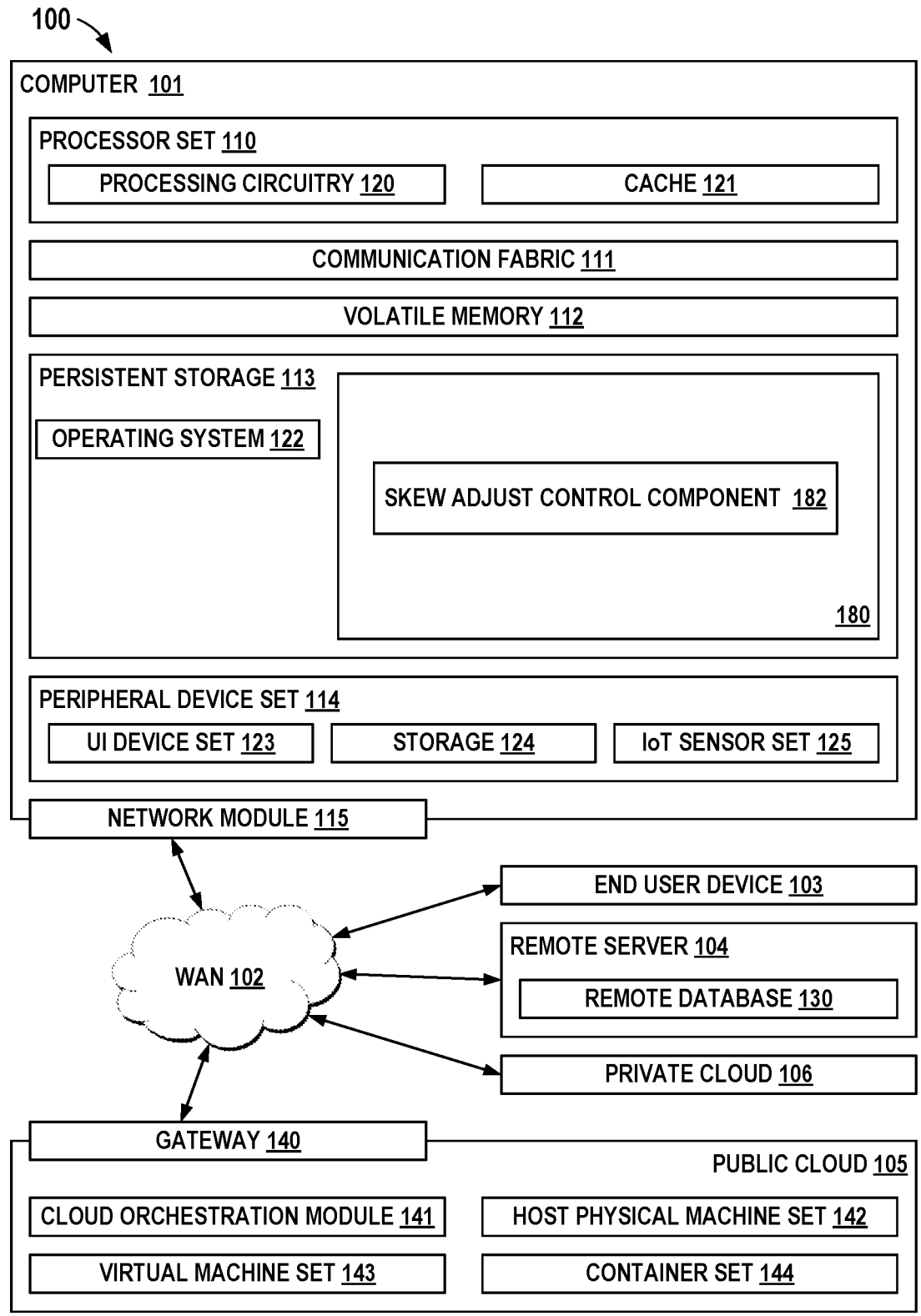
FIG. 1 is a block diagram of an example computer environment for use in conjunction with one or more disclosed embodiments.

Embodiments herein describe techniques for implementing an optimal coarse delay setting for an skew adjust control to synchronize clock skew between two clock meshes in an IC or chip, such as a computer multi-processor system. It should be understood that the disclosed embodiments are not limited to clock meshes of a specific clock distribution system; for example, the disclosed embodiments are application to clock trees and the like. The disclosed skew adjust control, methods, and systems enable effective and efficient operations to optimize a coarse delay setting to maintain for a functional mode of operation of the system, where fine delay steps are applied to an adjustable one of the clock meshes, based on measured clock skew, to synchronize clock skew of the clock meshes. A disclosed base adjustment mode of two clock meshes in a computer system having at least one processor includes iteratively measuring a clock skew between the clock meshes and applying a single coarse delay step or a set of fine delay steps to the clock mesh which can be adjusted, based on the measured skew until the measured skew is compensated, and identifying an optimal coarse delay setting to maintain for a functional mode of operation of the system. A disclosed closed loop skew adjust control applies a programmable delay comprising a set of fine delay steps to control skew between the clock meshes during functional operation of the computer system, with the coarse delay setting unchanged in the functional mode of operation.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Referring to FIG. 1, a computing environment 100 contains an example of an environment for the execution of at least some of the computer code involved in performing the inventive methods, such as Skew Adjust Control Component 182, at block 180. As discussed in more detail below, the Skew Adjust Control Component 182 can be used to identify optimal coarse programmable delay setting in a skew adjust closed loop control and maintained for adjusting the synchronisation of at least two clock meshes with a set of fine delay steps during operation of the computer system of disclosed embodiments. In addition to block 180, computing environment 100 includes, for example, computer 101, wide area network (WAN) 102, end user device (EUD) 103, remote server 104, public cloud 105, and private cloud 106. In this embodiment, computer 101 includes processor set 110 (including processing circuitry 120 and cache 121), communication fabric 111, volatile memory 112, persistent storage 113 (including operating system 122 and block 180, as identified above), peripheral device set 114 (including user interface (UI) device set 123, storage 124, and Internet of Things (IoT) sensor set 125), and network module 115. Remote server 104 includes remote database 130. Public cloud 105 includes gateway 140, cloud orchestration module 141, host physical machine set 142, virtual machine set 143, and container set 144.

COMPUTER 101 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 130. As is well understood in the art of computer technology, and depending upon the technology, performance of a computer-implemented method may be distributed among multiple computers and/or between multiple locations. On the other hand, in this presentation of computing environment 100, detailed discussion is focused on a single computer, specifically computer 101, to keep the presentation as simple as possible. Computer 101 may be located in a cloud, even though it is not shown in a cloud in FIG. 1. On the other hand, computer 101 is not required to be in a cloud except to any extent as may be affirmatively indicated.

PROCESSOR SET 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located "off chip." In some computing environments, processor set 110 may be designed for working with qubits and performing quantum computing.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 121 and the other storage media discussed below. The program instructions, and associated data, are accessed by processor set 110 to control and direct performance of the inventive methods. In computing environment 100, at least some of the instructions for performing the inventive methods may be stored in block 180 in persistent storage 113.

COMMUNICATION FABRIC 111 is the signal conduction path that allows the various components of computer 101 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 112 is any type of volatile memory now known or to be developed in the future. Examples include dynamic type random access memory (RAM) or static type RAM. Typically, volatile memory 112 is characterized by random access, but this is not required unless affirmatively indicated. In computer 101, the volatile memory 112 is located in a single package and is internal to computer 101, but, alternatively or additionally, the volatile memory may be distributed over multiple packages and/or located externally with respect to computer 101.

PERSISTENT STORAGE 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read only memory (ROM), but typically at least a portion of the persistent storage allows writing of data, deletion of data and re-writing of data. Some familiar forms of persistent storage include magnetic disks and solid state storage devices. Operating system 122 may take several forms, such as various known proprietary operating systems or open source Portable Operating System Interface-type operating systems that employ a kernel. The code included in block 180 typically includes at least some of the computer code involved in performing the inventive methods.

PERIPHERAL DEVICE SET 114 includes the set of peripheral devices of computer 101. Data communication connections between the peripheral devices and the other components of computer 101 may be implemented in various ways, such as Bluetooth connections, Near-Field Communication (NFC) connections, connections made by cables (such as universal serial bus (USB) type cables), insertion-type connections (for example, secure digital (SD) card), connections made through local area communication networks and even connections made through wide area networks such as the internet. In various embodiments, UI device set 123 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In some embodiments, storage 124 may take the form of a quantum computing storage device for storing data in the form of qubits. In embodiments where computer 101 is required to have a large amount of storage (for example, where computer 101 locally stores and manages a large database) then this storage may be provided by peripheral storage devices designed for storing very large amounts of data, such as a storage area network (SAN) that is shared by multiple, geographically distributed computers. IoT sensor set 125 is made up of sensors that can be used in Internet of Things applications. For example, one sensor may be a thermometer and another sensor may be a motion detector.

NETWORK MODULE 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the inventive methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN 102 may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 103 is any computer system that is used and controlled by an end user (for example, a customer of an enterprise that operates computer 101), and may take any of the forms discussed above in connection with computer 101. EUD 103 typically receives helpful and useful data from the operations of computer 101. For example, in a hypothetical case where computer 101 is designed to provide a recommendation to an end user, this recommendation would typically be communicated from network module 115 of computer 101 through WAN 102 to EUD 103. In this way, EUD 103 can display, or otherwise present, the recommendation to an end user. In some embodiments, EUD 103 may be a client device, such as thin client, heavy client, mainframe computer, desktop computer and so on.

REMOTE SERVER 104 is any computer system that serves at least some data and/or functionality to computer 101. Remote server 104 may be controlled and used by the same entity that operates computer 101. Remote server 104 represents the machine(s) that collect and store helpful and useful data for use by other computers, such as computer 101. For example, in a hypothetical case where computer 101 is designed and programmed to provide a recommendation based on historical data, then this historical data may be provided to computer 101 from remote database 130 of remote server 104.

PUBLIC CLOUD 105 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economics of scale. The direct and active management of the computing resources of public cloud 105 is performed by the computer hardware and/or software of cloud orchestration module 141. The computing resources provided by public cloud 105 are typically implemented by virtual computing environments that run on various computers making up the computers of host physical machine set 142, which is the universe of physical computers in and/or available to public cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after instantiation of the VCE. Cloud orchestration module 141 manages the transfer and storage of images, deploys new instantiations of VCEs and manages active instantiations of VCE deployments. Gateway 140 is the collection of computer software, hardware, and firmware that allows public cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 106 is similar to public cloud 105, except that the computing resources are only available for use by a single enterprise. While private cloud 106 is depicted as being in communication with WAN 102, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 105 and private cloud 106 are both part of a larger hybrid cloud.

Figure 2:
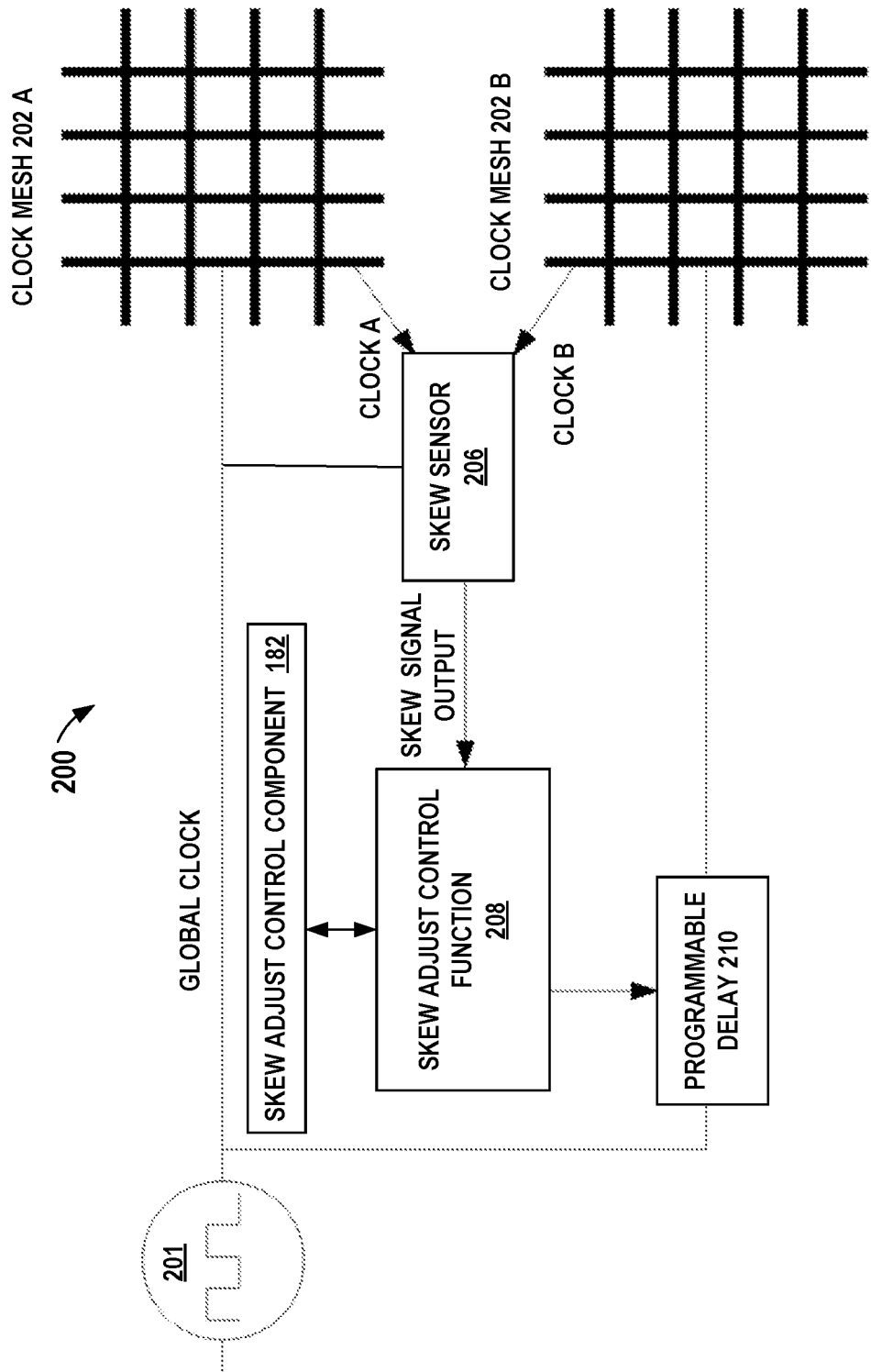
FIG. 2 is a block diagram of an example system for implementing skew adjust control for synchronizing skew between two clock meshes of one or more disclosed embodiments.

FIG. 2 illustrates an example system 200 for implementing skew adjust control functions of one or more embodiments of the present disclosure. System 200 can be used in conjunction with the Skew Adjust Control Component 182 and computer 101 of FIG. 1 of disclosed embodiments. While clock meshes are described, the disclosed embodiments are application to various clock distribution systems or networks including for example, clock trees and the like.

System 200 implements enhanced skew adjust control functions for synchronizing clock skew between at least two clock meshes of disclosed embodiments. As shown, system 200 includes a system clock 201 supplying a clock signal GLOBAL CLOCK to a clock mesh 202 A and a clock mesh 202 B of one embodiment, while more than two clock meshes can be synchronized with system 200. System 200 includes a skew sensor 206 receiving a clock signal input, such as a fixed clock mesh 202 A, and an enable clock input from an adjustable clock mesh, such as clock mesh 202 B, for example of a computing system, chip or IC. The skew sensor 206 iteratively measures a clock skew between the clock meshes 202 A and 202 B, and provides iteratively sensed skew signals indicated at line CLOCK SKEW OUTPUT to a skew adjust control function 208 of disclosed embodiments. As shown in system 200, the skew adjust control function 208 is coupled to the Skew Adjust Control Component 182 and a programmable delay 210. The skew adjust control function 208 controls a value of the programmable delay 210 applied to the adjustable clock mesh 202B, based on the CLOCK SKEW OUTPUT (e.g., iteratively sensed clock skew output) from the skew sensor 206.

In an embodiment, the respective programmable delays 210 comprise one of a coarse delay step or a set of fine delay steps, per measurement iteration, to compensate for the measured clock skew in the base adjustment mode of system 200. The respective programmable delays 210 decrease or increase the clock skew based on the measured clock skew, and are applied to the adjustable clock mesh 202 B until the clock skew is effectively compensated (e.g., minimal clock skew), and an optimal coarse programmable delay setting is identified during the base adjustment mode of system 200. In one embodiment, the disclosed optimal coarse delay setting is identified based on the respective programmable delays, to maximize a control range of the fine delay steps and minimize a distance to a 50% midpoint of the fine delay steps. In the functional mode of operation, system 200 repeatedly measures the clock skew between the clock meshes 202 A and 202 B, and applies a programmable delay 210 comprising a set of fine delay steps, based on the measured clock skew, to the adjustable clock mesh 202 B to synchronize clock skew of the clock meshes 202 A and 202 B, where the optimal coarse delay setting remains unchanged during the functional mode of operation.

For example, in an embodiment the applying the set of fine delay step further comprises sequentially applying single pico-seconds (pSec) delay steps over a range of about 20 pSec and 30 pSec, and a single coarse delay step per measurement iteration can provide a programmable delay 210 of about 20 pSec or less. It should be understood that the fine delay is not limited to this example range, various other delay steps and fine delay ranges can be implemented in accordance with disclosed embodiments.

Figure 3:
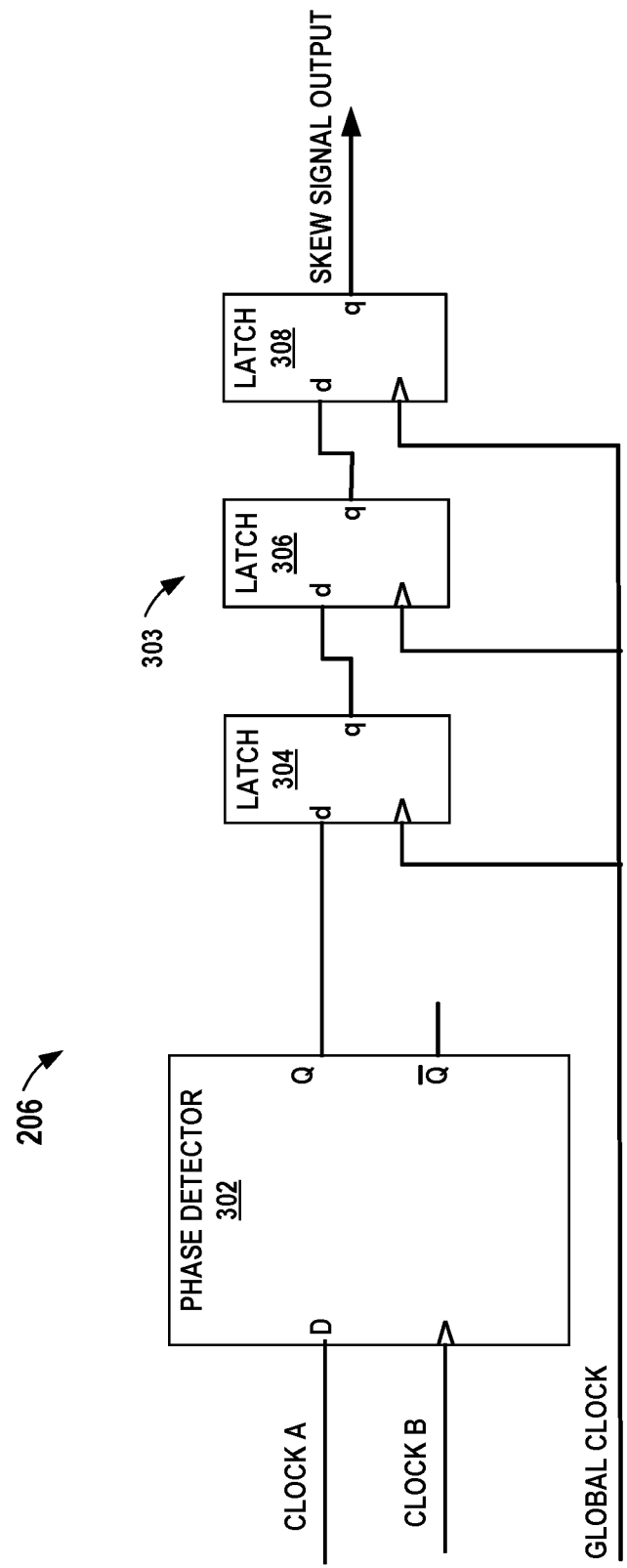
FIG. 3 is a block diagram of an example skew sensor of the system of FIG. 2 of one or more disclosed embodiments.

FIG. 3 illustrates an example skew sensor 206 for implementing the skew sensor 206 the system 200 of an embodiment. As shown, the skew sensor 206 receives clock signal inputs from the fixed and adjustable clock meshes 202 A and 202 B, iteratively measures a clock skew between the clock meshes, and provides a skew output of iteratively sensed skew signals. In an embodiment, the skew sensor 206 includes a phase detector 302 (e.g., implemented with a D flip-flop) receiving the clock signal inputs clock signal inputs from the fixed and adjustable clock meshes 202 A and 202 B, and providing detected phase output. In an embodiment, the skew sensor 206 includes a synchronizer coupled to the phase detector 302, receiving inputs of a reference clock (e.g., GLOBAL CLOCK) and the detected phase output (i.e., Q output) of the phase detector 302, and providing the iteratively sensed skew signals. As shown, the synchronizer comprises a plurality of pipeline latches 304, 306, and 308, with the pipeline latch 304 receiving the Q output of the phase detector 302, the pipeline latch 306 receiving the q output of the pipeline latch 304, and the pipeline latch 308 receiving the q output of the pipeline latch 308 with each pipeline latch receiving the reference Global clock (e.g. enable input). It should be understood that the skew sensor 206 can include various other suitable implementations.

Figure 4A:
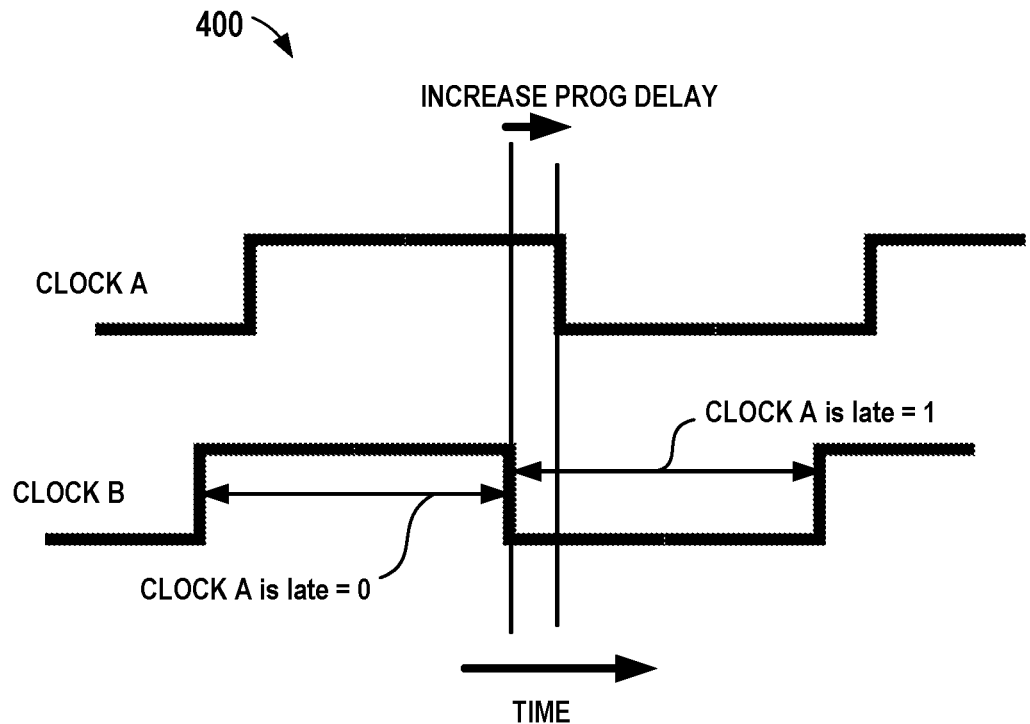
FIG. 4A is a chart illustrating clock skew shown relative to time of one or more disclosed embodiments.

FIG. 4A illustrates example clock skew 400 shown relative to time of one or more disclosed embodiments. In FIG. 4A, example clock signals of the illustrated example clock skew 400 are shown relative to time along the horizontal axis. The illustrated clock skew 400 includes a clock signal CLOCK A (e.g., fast clock) of the fixed clock mesh 202 A and a clock signal CLOCK B (e.g., slow clock) of the adjustable clock mesh 202 B. An arrow INCREASE PROG DELAY represents an example clock skew between the fixed and adjustable clock meshes 202 A and 202 B, such as shown in FIGS. 2 and 3 to be synchronized, which is measured relative to a falling edge of the fast clock signal CLOCK A. As illustrated with the clock signal CLOCK B or slow clock signal, a first arrow CLOCK A is late=0, and a second arrow CLOCK A is late=1 represents example logic levels of the fast clock signal CLOCK A relative to the slow clock signal CLOCK B.

Figure 4B:
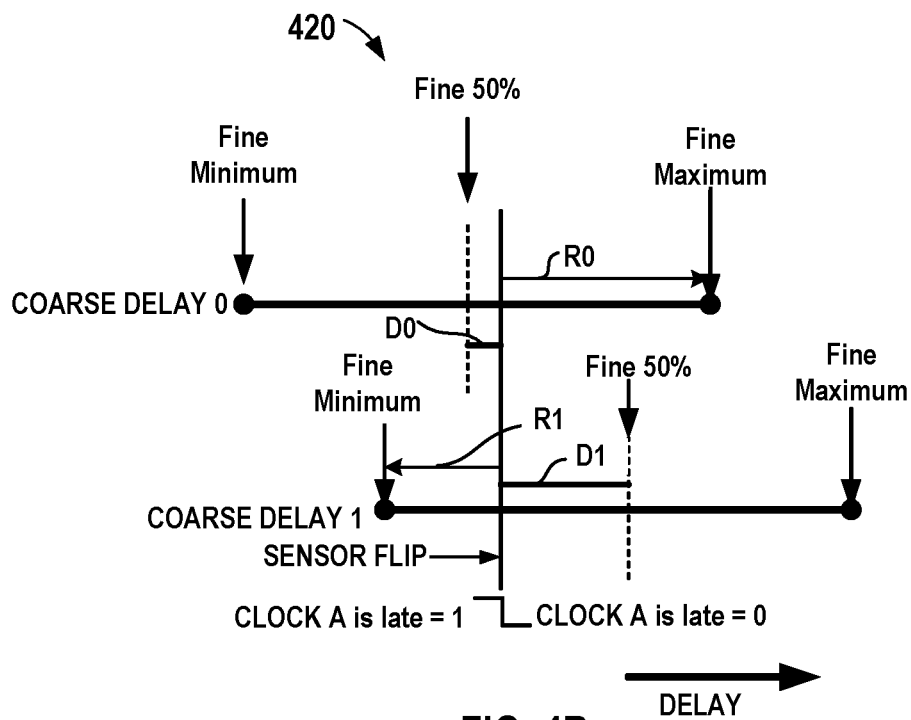
FIG. 4B is a chart illustrating examples of skew adjust control functions shown relative to delay of one or more disclosed embodiments.

FIG. 4B illustrates examples of skew adjust control functions 420 shown relative to delay along the horizontal axis of one or more disclosed embodiments. In the illustrative skew adjust control functions 420, a first line representing Coarse Delay 0 includes a zero coarse programmable delay and a second line representing Coarse Delay 1 includes, for example a single coarse step programmable delay. As shown, the dots on the left side ends of the first and second lines Coarse Delay 0 and Coarse Delay 1 represent the respective coarse delay settings and represent a minimum fine delay step (indicated by arrow Fine Minimum) of programmable delay or zero fine programmable delay, for the respective current coarse step programmable delay. The dots on the right side ends of the first and second lines Coarse Delay 0 and Coarse Delay 1 represent a maximum fine delay step (indicated by arrow Fine Maximum) of a set of fine delay steps providing a maximum programmable delay 210. For example, the programmable delay of the set of fine delay steps can include an illustrative range of about 20 pSec to 30 pSec. The single coarse delay step per measurement iteration can provide an illustrative programmable delay 210 of about 20 pSec or less, while various other delay values can be implemented by either or both the fine delay steps and the single coarse delay step. A 50% midpoint of the fine delay steps between the minimum and maximum fine delay steps Fine Minimum and Fine Maximum is represented by a dotted line Fine 50%. A sensor flip (e.g., a synchronization point of skew sensor 206) is represented by a line SENSOR FLIP between delay regions indicated as CLOCK A is late=1 on the left side of the line SENSOR FLIP, and indicated as CLOCK A is late=0 on the right side of the line SENSOR FLIP, which symbolizes the point of synchronization of the fixed and adjustable clock meshes 202 A and 202 B.

In a disclosed base adjustment operations of the skew adjust control function 208, a goal is to achieve a synchronization point SENSOR FLIP as close as possible to the 50% fine delay (i.e., minimize a distance to 50% fine delay) and maximize a minimal control range of the fine delay steps for fine delay adjustment from the synchronization point SENSOR FLIP to the minimum fine delay step Fine Minimum and to the a maximum fine delay step Fine Maximum (i.e., maximize the minimal control range of the fine delay steps in the directions to both Fine Minimum and Fine Maximum). As shown, a minimum range for fine delay adjustment with Coarse Delay 1 indicated by line R1 between the synchronization point SENSOR FLIP and the Fine Minimum is much smaller than the minimum range of fine delay adjustment with Coarse Delay 0 indicated by line R0 between the synchronization point SENSOR FLIP and the Fine Maximum. A distance D0 from the synchronization point SENSOR FLIP to the 50% fine delay with Coarse Delay 0 is substantially smaller than the distance D1 to the 50% fine delay with Coarse Delay 0.

Figure 5A:
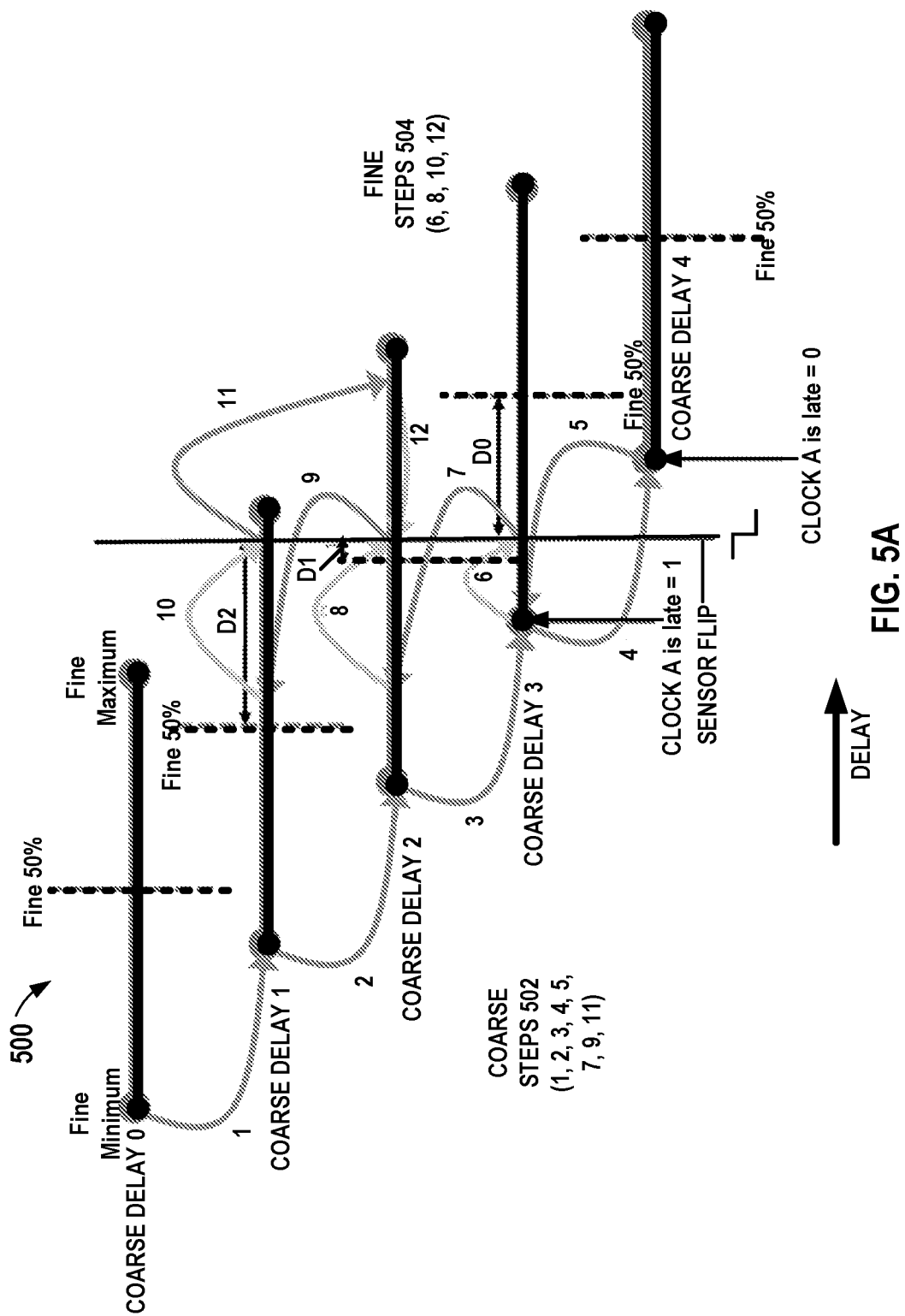
FIGS. 5A and 5B are charts together illustrating example coarse delay and fine delay steps for implementing skew adjust control for synchronizing skew between two clock meshes of one or more disclosed embodiments.
Figure 5B:
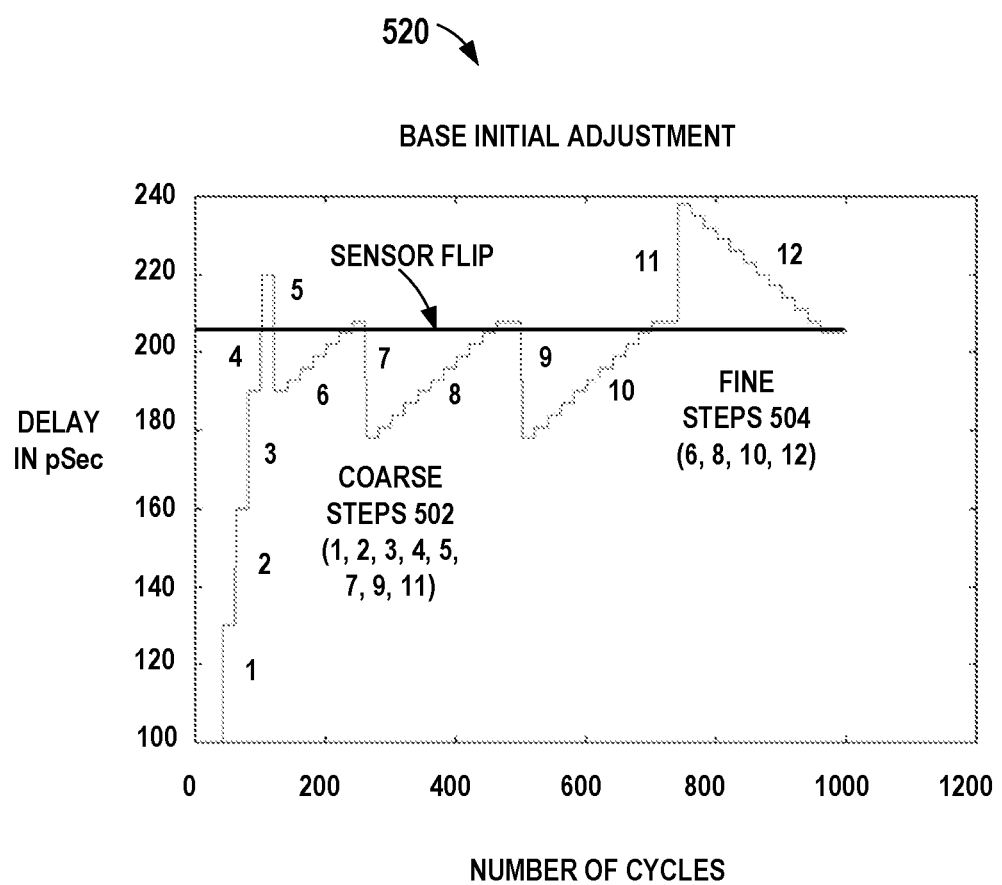

FIG. 5A and FIG. 5B illustrate respective example operations of skew adjust control functions 500, 520 for implementing skew adjust control for synchronizing clock skew between two clock meshes to identify an optimal coarse delay setting of one or more disclosed embodiments. In FIG. 5A and FIG. 5B, the example operations of skew adjust control functions 500, 520 of a base initial adjustment mode are shown for identifying an optimal coarse delay setting to maintain for a functional mode of operation of a given system, such as including the fixed and adjustable clock signals of clock meshes 202 A and 202 B.

In the example operations of skew adjust control functions 500 of FIG. 5A, sequential programmable delays, such as programmable delay 210 of FIG. 2, are shown relative to the horizontal axis, where the respective sequential programmable delays comprise one of a coarse delay step 502 or a set of fine delay steps 504, to compensate for the measured clock skew. In the examples of skew adjust control functions 520 of FIG. 5B, the sequential programmable delays 210 are shown relative to the vertical axis and a number of cycles are shown relative the horizontal axis. In the illustrative skew adjust control functions 500 and 520 of FIG. 5A and FIG. 5B, the coarse delay step 502 or the set of fine delay steps 504 increases or decreases the clock skew based on based on the measured clock skew per measurement iteration. In an embodiment, the set of the fine delay steps 504 can provide a variable programmable delay per measurement iteration based on iteratively measuring the clock skew.

In FIG. 5A and FIG. 5B, the illustrative skew adjust control functions 500 and 520 include eight (8) coarse delay steps 1, 2, 3, 4, 5, 7, 9 and 11, and four (4) sets of fine delay steps 504 6, 8, 10 and 12 of the base initial adjustment mode for identifying the optimal coarse delay setting. The coarse delay step 502 applied per measurement iteration, increases or decreases the clock skew based on the based on the measured clock skew; similarly, the set of the fine delay steps 504 applied per measurement iteration, increases or decreases the clock skew based on based on the measured clock skew, in accordance with disclosed embodiments. For example, the sequential programmable delays 210 (e.g. of FIG. 2) are applied to the adjustable clock signal of the adjustable clock mesh 202 B, based on iteratively sensed skew signals of sensor 206, to compensate for clock skew in accordance with disclosed embodiments.

As shown in FIG. 5A and FIG. 5B, the programmable delay of the single coarse delay step 502 per measurement iteration is substantially greater than the programmable delay of one fine delay step of the set of the fine delay steps 504. As shown in FIG. 5A and FIG. 5B, the set of the fine delay steps 504 per measurement iteration can provide different total programmable delay values based on the measured clock skew. In FIG. 5B, example programmable delay values in pSec are shown relative the vertical axis for the coarse delay coarse delay steps 502, 1, 2, 3, 4, 5, 7, 9 and 11, and the sets of fine delay steps 504 6, 8, 10 and 12 and the number of cycles of all the delay steps of the base initial adjustment mode are shown relative the horizontal axis.

As shown in FIG. 5A and FIG. 5B, the base initial adjustment mode begins with four sequential coarse delay steps 1, 2, 3 and 4 applied before a synchronizing point SENSOR FLIP is reached.

As shown in FIG. 5A, the coarse delay step 4 provides a programmable delay extending from a CLOCK A is late=1 of the Coarse Delay 3 and a CLOCK A is late=0 of the Coarse Delay 4 and crossing the synchronizing point SENSOR FLIP. The coarse delay step 5 provides a decreased programmable delay extending from the CLOCK A is late=0 of the Coarse Delay 4 back to the CLOCK A is late=1 of the Coarse Delay 3, and crossing the synchronizing point SENSOR FLIP between of the Coarse Delays 4 and 3. A set of fine delay steps provides an increased programmable delay extending from the CLOCK A is late=1 of the Coarse Delay 3 to the synchronizing point SENSOR FLIP of the Coarse Delay 3. Next a decreased programmable delay to the Coarse Delay 2 is provided by a coarse delay step 7, with a next increased programmable delay provided by a set of fine delay steps 8 of the Coarse Delay 2. As shown, a next coarse delay step 9 provides a next decreased programmable delay to the Coarse Delay 1, a set of fine delay steps 10 provides a next increased programmable delay at the Coarse Delay 1. A next coarse delay step 11 provides another increased programmable delay to the Coarse Delay 2, which is followed by a next decreased programmable delay provided by a set of fine delay steps 12 at the Coarse Delay 2, where an optimal coarse delay setting is identified.

The optimal coarse delay setting identified by the set of fine delay steps 12, which is maintained for the functional mode of operation, is located at the synchronizing point SENSOR FLIP of Coarse Delay 2, where the distance (i.e., delay) of the synchronization point SENSOR FLIP to the 50% midpoint fine delay is minimized as indicated by arrow D1, and the minimal control range of fine delay adjustment for the fine delay steps is maximized with the synchronization point SENSOR FLIP and the minimum fine delay Fine Minimum and maximum fine delay Fine Maximum. As shown in FIG. 5A, the minimized distance of the synchronization point SENSOR FLIP to the 50% fine delay D1 is substantially smaller than relative distances D2 at coarse delay 1 and D0 at coarse delay 3 from the synchronization point SENSOR FLIP to the respective associated 50% fine delay.

Figure 6A:
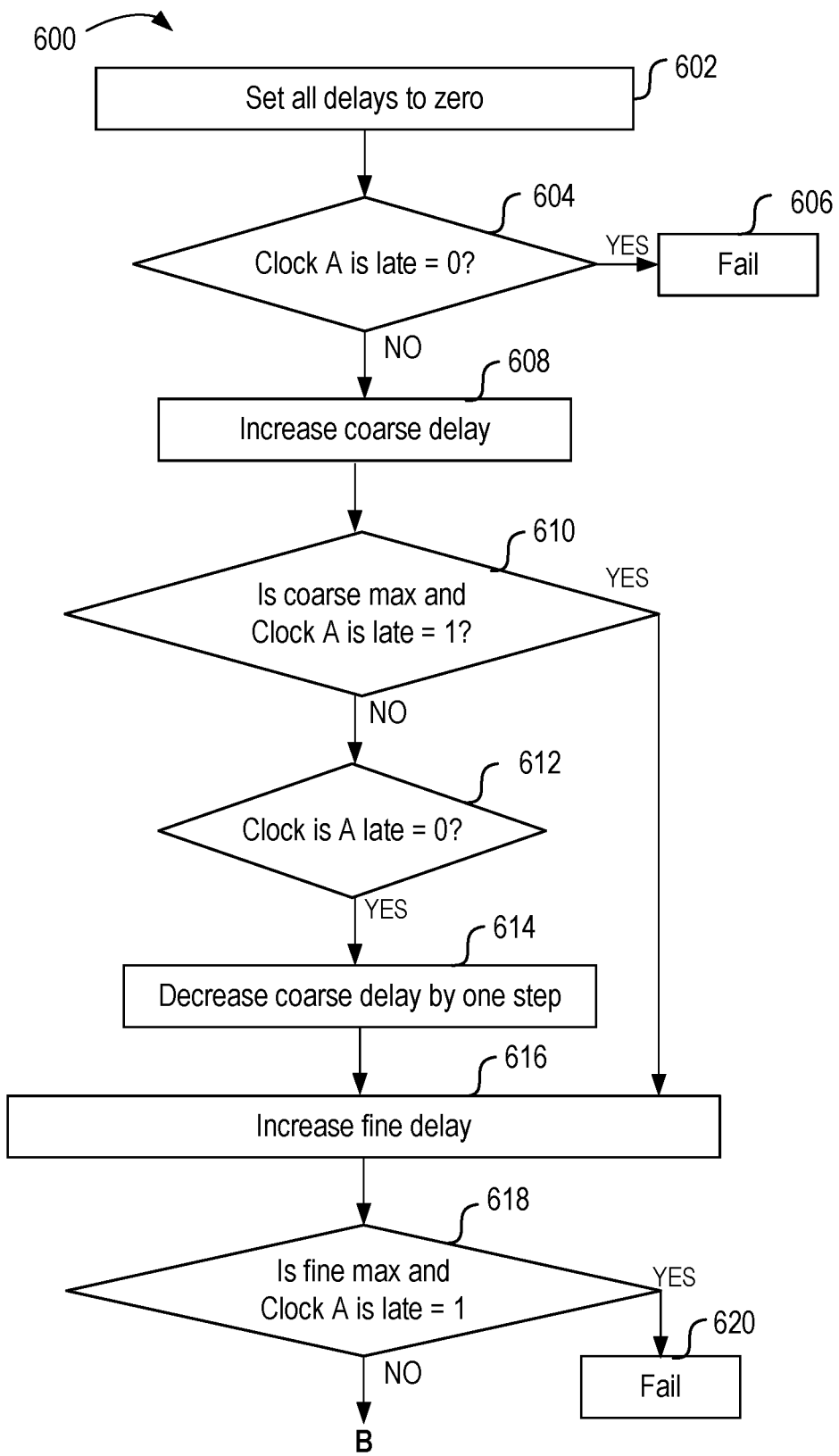
FIGS. 6A, 6B, and 6C together provide a flow chart together illustrating example operations of a method coarse delay and fine delay steps for implementing skew adjust control of one or more disclosed embodiments.
Figure 6B:
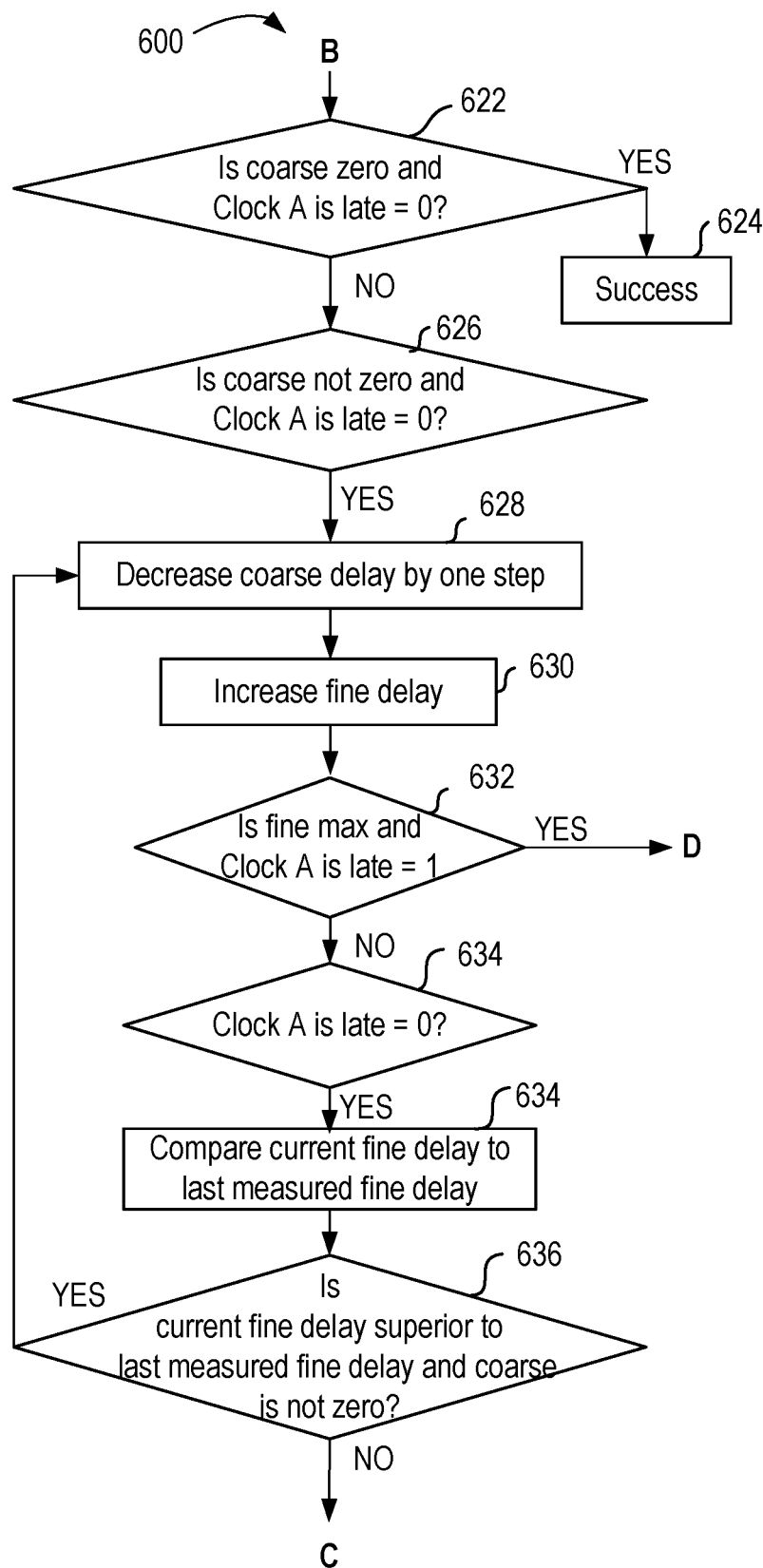
Figure 6C:
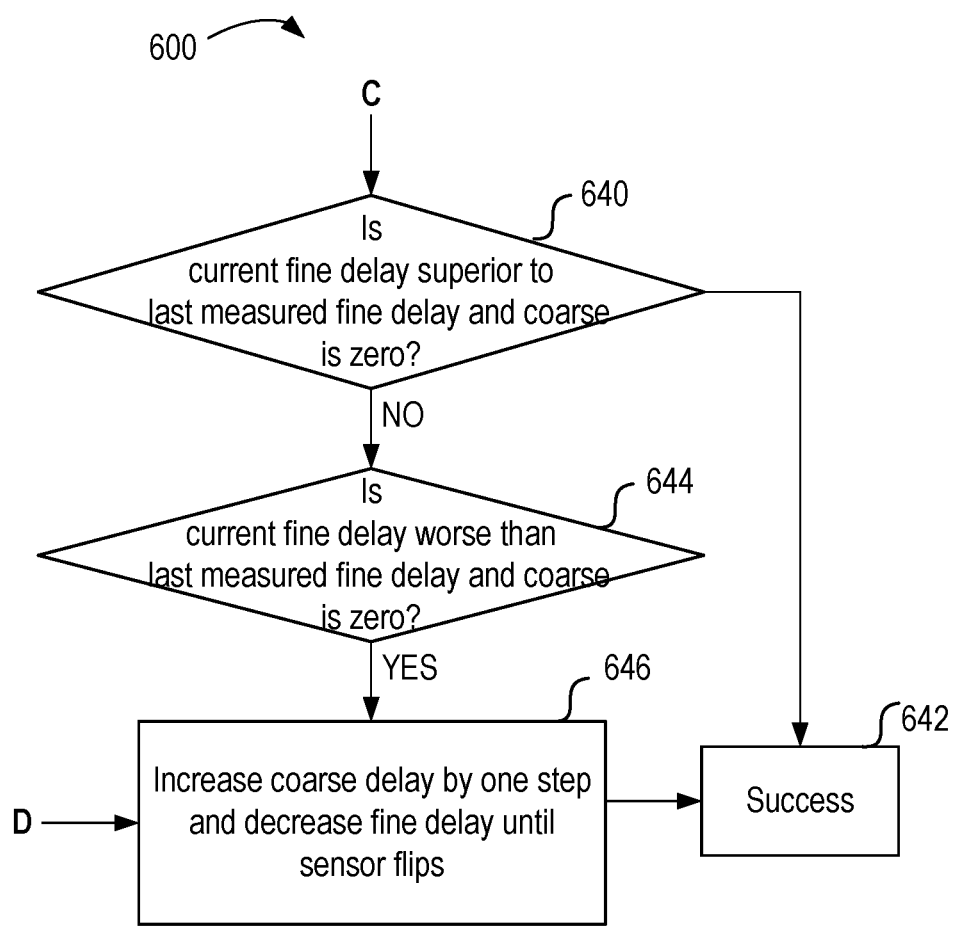

FIGS. 6A, 6B, and 6C together provide a flow chart together illustrating example operations of coarse delay and fine delay steps of a method 600 for implementing skew adjust control of one or more disclosed embodiments. Method 600 can be implemented by system 200 in conjunction with the Skew Adjust Control Component 182 and computer 101 of FIG. 1 of disclosed embodiments. Method 600 illustrates a base initial adjustment process of implementing skew adjust control for identifying the optimal coarse delay setting, such as illustrated in FIG. 5A and FIG. 5B.

At block 602, system 200 sets the delays to zero at the start of the base initial adjustment process. For example, the coarse delay and fine delay steps are set to zero delay. At decision block 604, system 200 checks if Clock A is late=0, such as illustrated and described with respect to FIG. 4B and FIG. 5A where the synchronizing point SENSOR FLIP represents the synchronization point level transition of skew sensor 206 between delay regions before and after synchronization of the fixed and adjustable clock meshes 202 A and 202 B indicated as CLOCK A is late=1 and CLOCK A is late=0. At block 606, when determined that Clock A is late=0, the base initial adjustment process fails, where the current base initial adjustment process ends, and a new base initial adjustment process will be performed to identify optimal coarse delay setting. Otherwise when determined that Clock A is late=0 is false, the base initial adjustment process continues and at block 608, system 600 increases coarse delay. At decision block 610, system 200 determines if the coarse delay is maximum and Clock A is late=1. If false, at decision block 612 system 200 checks if CLOCK A is late=0. If CLOCK A is late=0 is true, at block 614 system 200 decreases the coarse delay by one step, for example as illustrated at step 5 in FIG. 5A. At block 616, system 200 increases the fine delay, after decreasing the coarse delay by one step, and when determined that the coarse delay is maximum and Clock A is late=1 at decision block 610, such as illustrated at step 6 in FIG. 5A.

At decision block 618, system 200 determines if the fine delay is maximum and Clock A is late=1. When fine delay is maximum and Clock A is late=1, the base initial adjustment process fails at block 620. If false, operations continue to decision block 622 following entry point B in FIG. 6B.

In FIG. 6B at decision block 622, system 200 determines if coarse delay is zero and Clock A is late=0. When coarse delay is zero and Clock A is late=0, system 200 has identified the optimal coarse delay setting as indicated by Success at block 624 completing the base initial adjustment process. Otherwise, when coarse delay is not zero and Clock A is late=0 is identified as indicated at decision block 626, at block 628 system 200 decreases the coarse delay by one step. At clock 630, system 200 increases the fine delay. At decision block 632, system 200 determines if fine delay is maximum and Clock A is late=1. When determined that fine delay is maximum and Clock A is late=1, operations continue at block 646 in FIG. 6C following entry point D.

Otherwise, when fine delay is maximum and Clock A is late=1 is not true, at decision block 634, system 200 determines if Clock A is late=0. At block 634, system 200 compares the current fine delay to the last measured fine delay. At decision block 636, system 200 determines whether the current fine delay is superior to the last measured fine delay and the coarse delay is not zero. If true, system 200 returns to block 628 to decrease the coarse delay by one step and continues. When the current fine delay is superior to the last measured fine delay and the coarse delay is not zero is not true, operations continue at decision block 640 in FIG. 6C.

In FIG. 6C, at decision block 640, system 200 determines whether the current fine delay is superior to the last measured fine delay and the coarse delay is zero. When the current fine delay is superior to the last measured fine delay and the coarse delay is zero, system 200 has identified the optimal coarse delay setting as indicated by Success at block 642. Otherwise, when determined that the current fine delay is superior to the last measured fine delay and the coarse delay is zero is false; at decision block 644, system 200 determines whether the current fine delay is worse than the last measured fine delay and the coarse delay is zero. When determined that the current fine delay is worse than the last measured fine delay and the coarse delay is zero, at block 646 system 200 increase the coarse delay by one step, and decrease the fine delay until the sensor flips, such as illustrated at steps 11 and 12 in FIG. 5A. When the sensor flips, system 200 has identified the optimal coarse delay setting as indicated by Success at block 642.

Figure 7A:
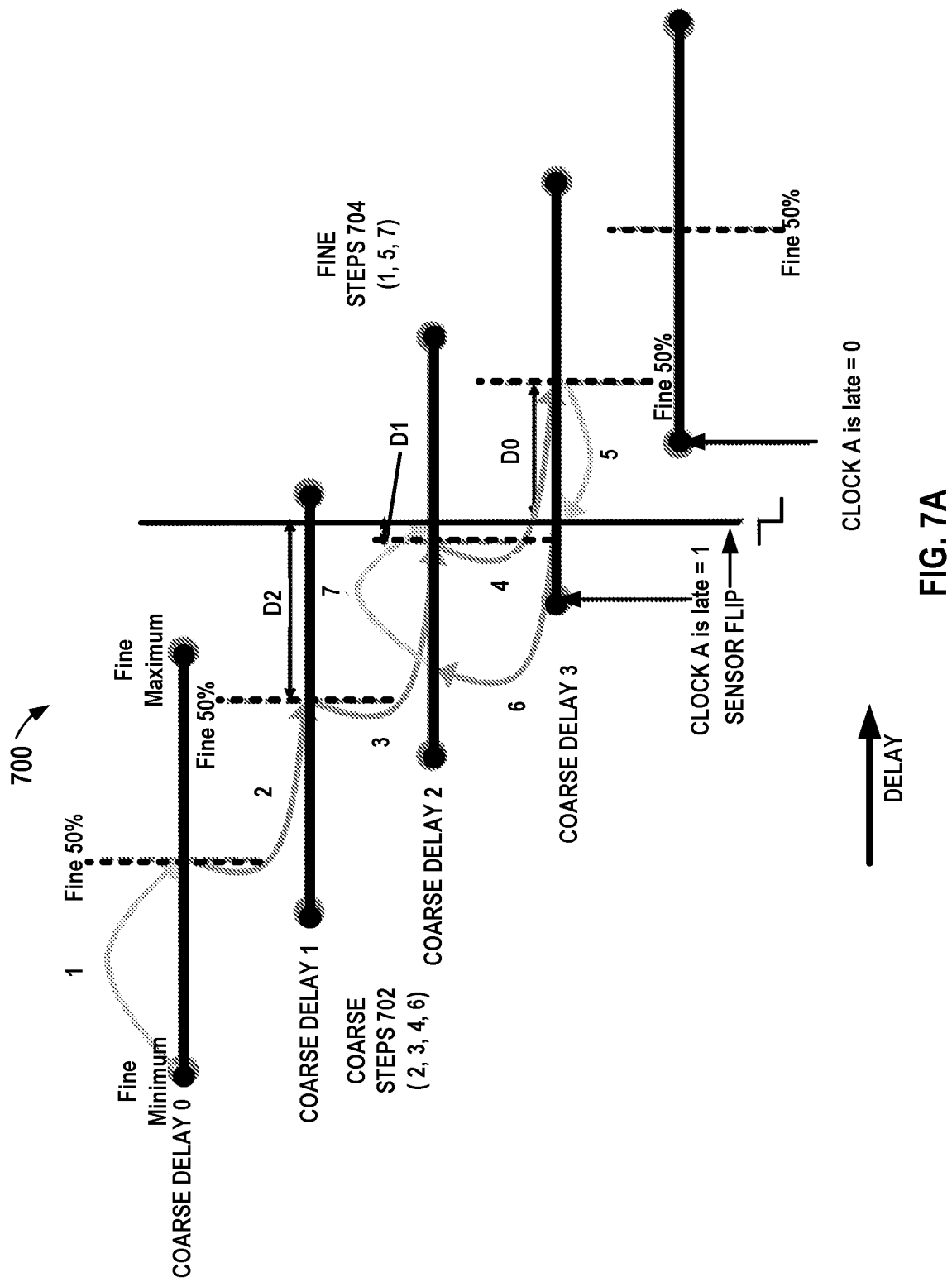
FIGS. 7A and 7B are charts together illustrating example coarse delay and fine delay steps for implementing skew adjust control for synchronizing skew between two clock meshes of one or more disclosed embodiments.
Figure 7B:
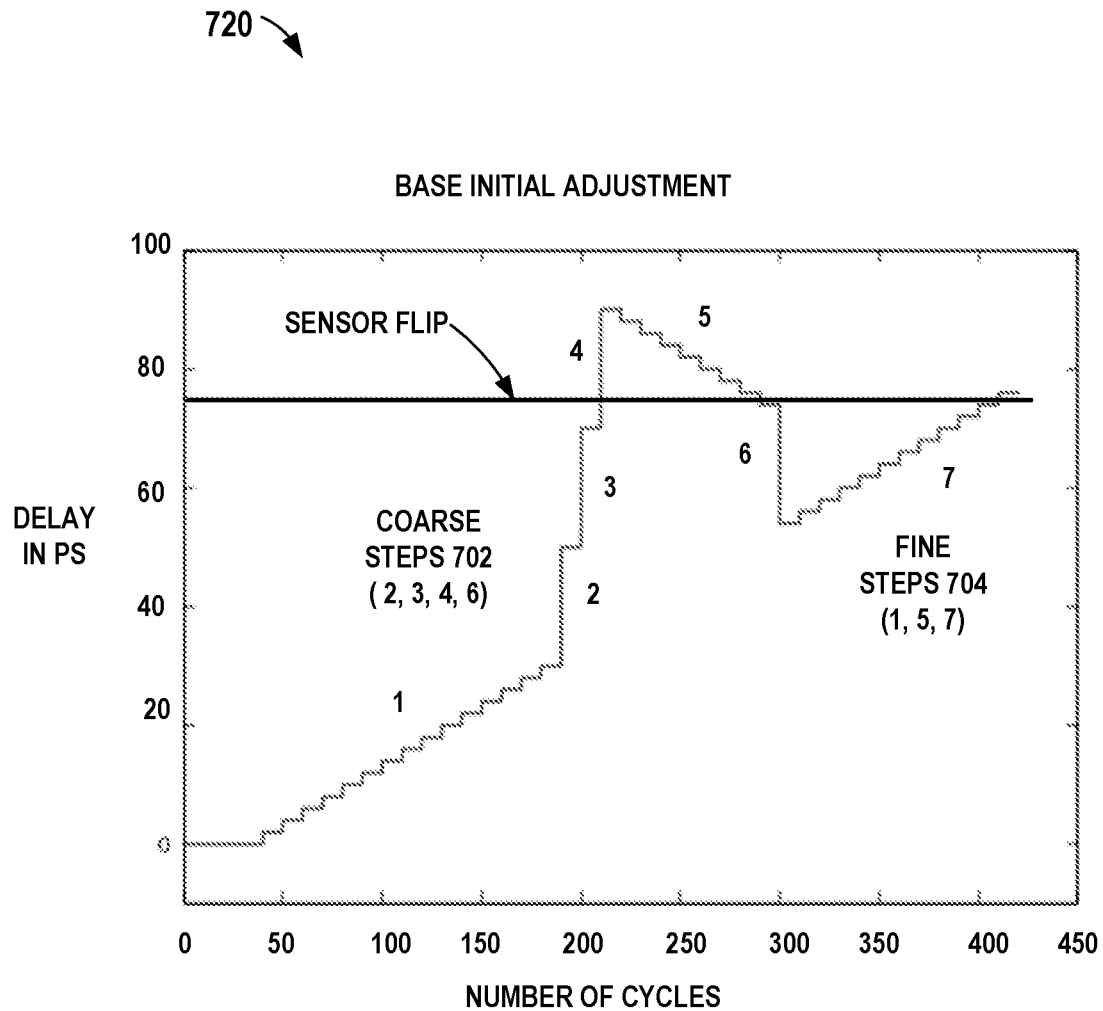

FIGS. 7A and 7B illustrate further example operations of skew adjust control functions 700, 720 for implementing skew adjust control for synchronizing clock skew between two clock meshes to identify an optimal coarse delay setting of one or more disclosed embodiments. In FIGS. 7A and 7B, the example operations of skew adjust control functions 700, 720 of a base initial adjustment mode are shown for identifying an optimal coarse delay setting to maintain for a functional mode of operation of a given system, such as including the fixed and adjustable clock signals of clock meshes 202 A and 202 B.

In the example operations of skew adjust control functions 700 of FIG. 7A, sequential programmable delays, such as programmable delay 210 of FIG. 2, are shown relative to the horizontal axis, where the respective sequential programmable delays comprise one of a coarse delay step 702 or a set of fine delay steps 704, to compensate for the measured clock skew. In the examples of skew adjust control functions 720 of FIG. 5B, the sequential programmable delays 210 are shown relative to the vertical axis and a number of cycles are shown relative the horizontal axis. In the illustrative skew adjust control functions 700 and 720 of FIGS. 7A and 7B, the coarse delay step 702 or the set of fine delay steps 704 increases or decreases the clock skew based on based on the measured clock skew per measurement iteration.

In FIG. 7A and FIG. 7B, the illustrative skew adjust control functions 700 and 720 include four (4) coarse delay steps 2, 3, 4, and 6, and three (3) sets of fine delay steps 1, 5 and 7 of the base initial adjustment mode for identifying the optimal coarse delay setting. As shown in FIG. 7A and FIG. 7B, the base initial adjustment mode begins with a set of fine delay steps 1 where the 50% midpoint of the fine delay steps is reached between Fine Minimum and Fine Maximum. The initial set of fine delay steps 1 is followed three coarse delay steps 2, 3 and 4 applied before a synchronizing point SENSOR FLIP is reached. A next set of fine delay steps 5 provides a decreased programmable delay to reach the synchronizing point SENSOR FLIP, which is followed by a coarse delay step 6 providing a decreased programmable delay to return to the synchronizing point SENSOR FLIP. A next set of fine delay steps 7 provides an increase programmable delay to reach the synchronizing point SENSOR FLIP closest to the 50% fine delay, minimizing a distance D1 to 50% fine delay and maximizing a minimal control range of the fine delay steps for fine delay adjustment from the synchronization point SENSOR FLIP to the minimum fine delay step Fine Minimum and to the a maximum fine delay step Fine Maximum, such as shown in FIGS. 4B, and 5A. The fine delay steps 7 completes the base initial adjustment mode, identifying the optimal coarse delay setting at the illustrated COARSE DELAY 2 to maintain for the functional mode of system operation. As shown, the distance D1 to 50% fine delay with coarse delay 2 is substantially smaller than both the distance D0 to 50% fine delay with COARSE DELAY 3 and the distance D2 to 50% fine delay with COARSE DELAY 1.

Figure 8A:
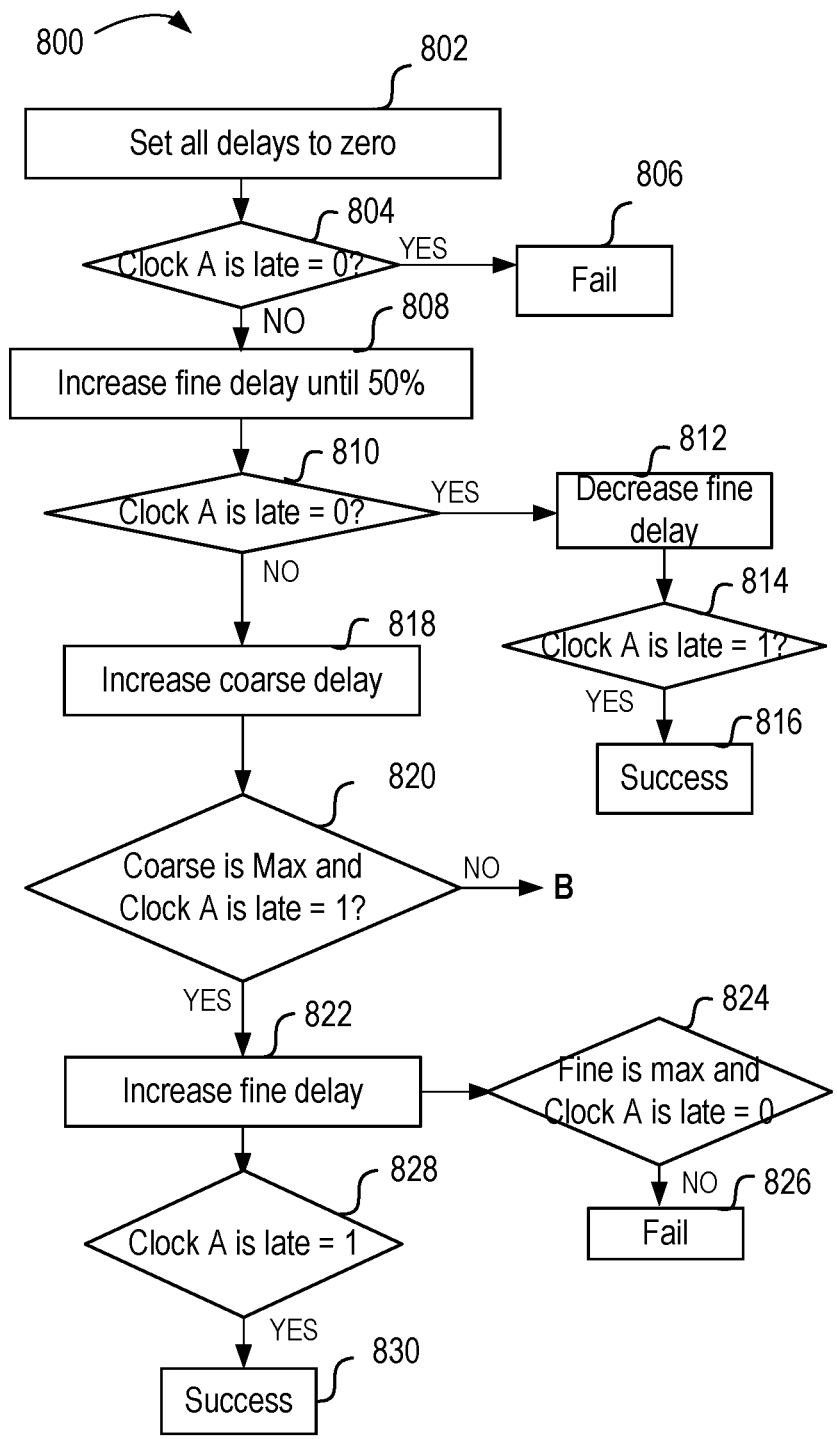
FIGS. 8A, 8B, and 8C together provide a flow chart together illustrating example operations of a method coarse delay and fine delay steps for implementing skew adjust control of one or more disclosed embodiments.
Figure 8B:
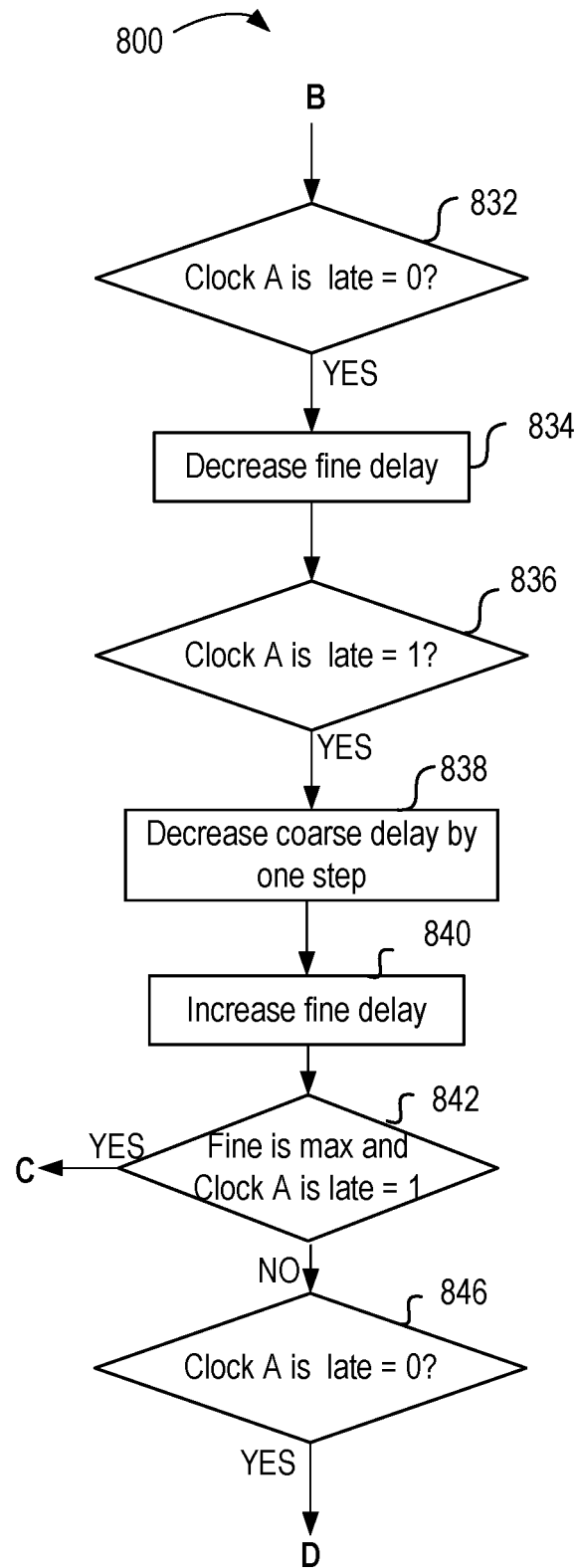
Figure 8C:
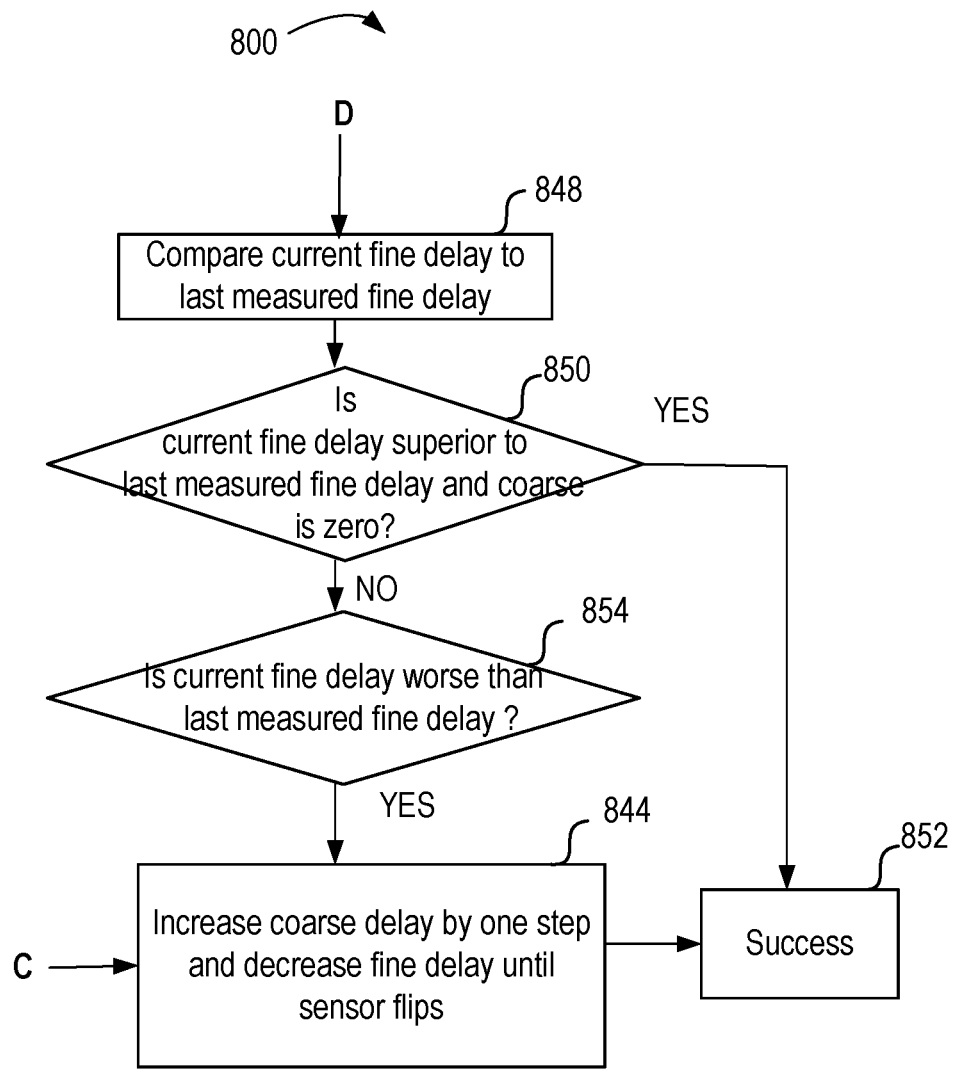

FIGS. 8A, 8B, and 8C together illustrate example operations of a method 800 of a base initial adjustment process for implementing skew adjust control for identifying the optimal coarse delay setting, such as illustrated in FIG. 7A and FIG. 7B of one or more disclosed embodiments. Method 800 can be implemented by system 200 in conjunction with the Skew Adjust Control Component 182 and computer 101 of FIG. 1 of disclosed embodiments.

At block 802, system 200 sets all delays to zero at the start of the base initial adjustment process of method 800. For example, the coarse delay and fine delay steps are set to zero delay. At decision block 804, system 200 checks if Clock A is late=0, such as illustrated and described with respect to FIG. 4B and FIG. 7A where the synchronizing point SEN-SOR FLIP represents the synchronization point of level transition of skew sensor 206 between delay regions before and after synchronization of the fixed and adjustable clock meshes 202 A and 202 B indicated as Clock A is late=1 and Clock A is late=0. At block 806, when determined that Clock A is late=0, the base initial adjustment process fails. Otherwise, when Clock A is late=1, at block 808, system 200 increases the fine delay until the 50% fine delay point. At decision block 810, system 200 determines if Clock A is late=0. If true, at block 812 system 200 decreases the fine delay, for example as illustrated at step 5 in FIG. 7A. At decision block 814, system 200 determines if Clock A is late=1. If true, at block 816 system 200 identifies the optimal coarse delay as indicated by Success. Otherwise, at block 818, system 200 increases the coarse delay, when determined at decision block 810 that Clock A is late=0 is false. At decision block 820, system 200 determines if Coarse delay is maximum and Clock A is late=1. If determined that Coarse delay is maximum and Clock A is late=1 is false, operations continue at decision block 832 following entry point B in FIG. 8B.

At block 822, system 200 increases fine delay if determined at decision block 820 that Coarse delay is maximum and Clock A is late=1 is true. At decision block 824, system 200 determines if fine is maximum and Clock A is late=0. If true that fine is maximum and Clock A is late=1, the base initial adjustment process fails as indicated at block 826. At decision block 828, system 200 determines if Clock A is late=1. If true that Clock A is late=1, at block 830 system 200 identifies the optimal coarse delay as indicated by Success.

In FIG. 8B, at decision block 832 system 200 determines if Clock A is late=0. When determined that Clock A is late=0 at decision block 832, at block 834, system 200 decreases the fine delay. At decision block 836 system 200 determines if Clock A is late=1. When determined that Clock A is late=1 (indicating a sensor flip), at block 838, system 200 decreases the coarse delay by one step, such as illustrated at step 6 in FIG. 7A. At block 840, system 200 increases fine delay. At decision block 842, system 200 determines if fine is maximum and Clock A is late=1. If true that fine is maximum and Clock A is late=1, operations continue at block 844 following entry point C in FIG. 8C.

Otherwise, if false that fine is maximum and Clock A is late=1, at decision block 846, system 200 determines if Clock A is late=0. When determined that Clock A is late=0 at decision block 832, operations continue to block 848 following entry point D in FIG. 8C.

In FIG. 8C, at block 848, system 200 compares the current fine delay to the last measured fine delay. At decision block 850, system 200 determines whether the current fine delay is superior to the last measured fine delay and the coarse delay is not zero. If true, system 200 completes the base initial adjustment mode, identifying the optimal coarse delay setting at block 852 indicated by Success. Otherwise, at decision block 854, system 200 determines whether the current fine delay is worse than the last measured fine delay.

When determined at decision block 854 that the current fine delay is worse than the last measured fine delay, and following entry point C at block 844, system 200 increases coarse delay by one step and decreases fine delay until the sensor flips, such as illustrated at steps 6 and 7 in FIG. 7A. As indicated by Success at block 854, system 200 completes the base initial adjustment mode, identifying the optimal coarse delay setting, such as illustrated in FIG. 7A at the illustrated COARSE DELAY 2 to maintain for the functional mode of system operation.

Figure 9A:
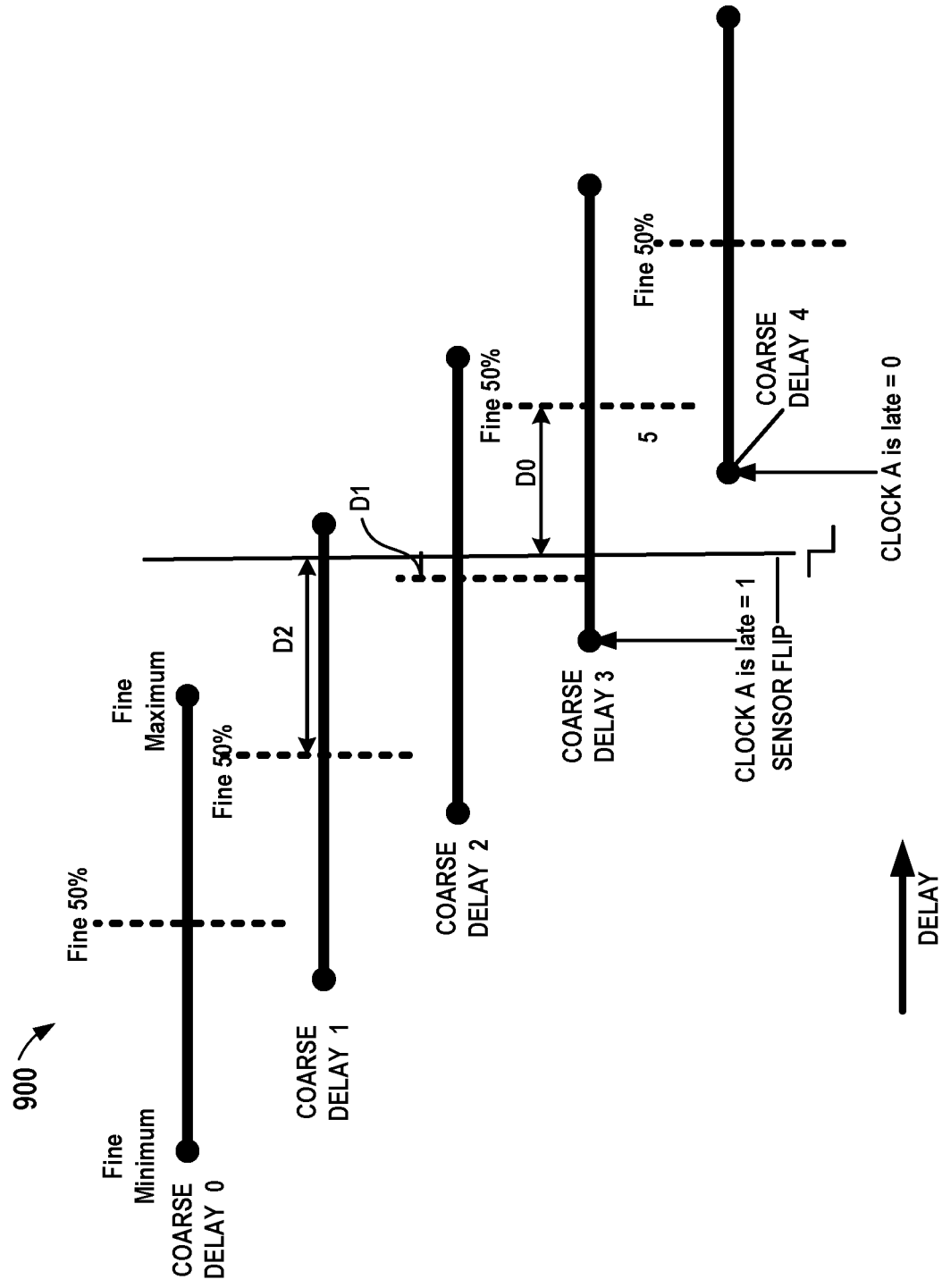
FIGS. 9A and 9B are charts together illustrating examples clock skew cases for skew adjust control operations of one or more disclosed embodiments.

FIG. 9A illustrates example skew adjust control functions 900 shown relative to delay of one or more disclosed embodiments. As shown, the skew adjust control functions 900 include multiple lines representing possible coarse delay settings COARSE DELAY 0-4, such as illustrated in FIGS. 5A and 7A. As shown, each of the five coarse delay settings Coarse Delay 0, 1, 2, 3, and 4 includes a range of fine delay steps between Fine Minimum and Fine Maximum with a 50% midpoint of the fine delay steps between Fine Minimum and Fine Maximum represented by a dotted line. In FIG. 9A, an example synchronization point SENSOR FLIP between Clock A is late=1 and Clock A is late=0 is shown, as described above.

As shown at the Coarse Delay 2, the illustrated synchronization point SENSOR FLIP occurs a distance D1 after the fine delay midpoint Fine 50% of the Coarse Delay 2. At the Coarse Delay 3, the illustrated synchronization point SENSOR FLIP occurs a distance D0 before the fine delay midpoint Fine 50% of the Coarse Delay 3. At the Coarse Delay 1, the illustrated synchronization point SENSOR FLIP occurs a distance D2 after the fine delay midpoint Fine 50% of the Coarse Delay 1. The minimal distance from the synchronization point SENSOR FLIP to the fine delay midpoint Fine 50%, is the distance D1 of the Coarse Delay 2, which is much smaller than both the distance D0 of the Coarse Delay 3 and the distance D2 of the Coarse Delay 1.

Figure 9B:
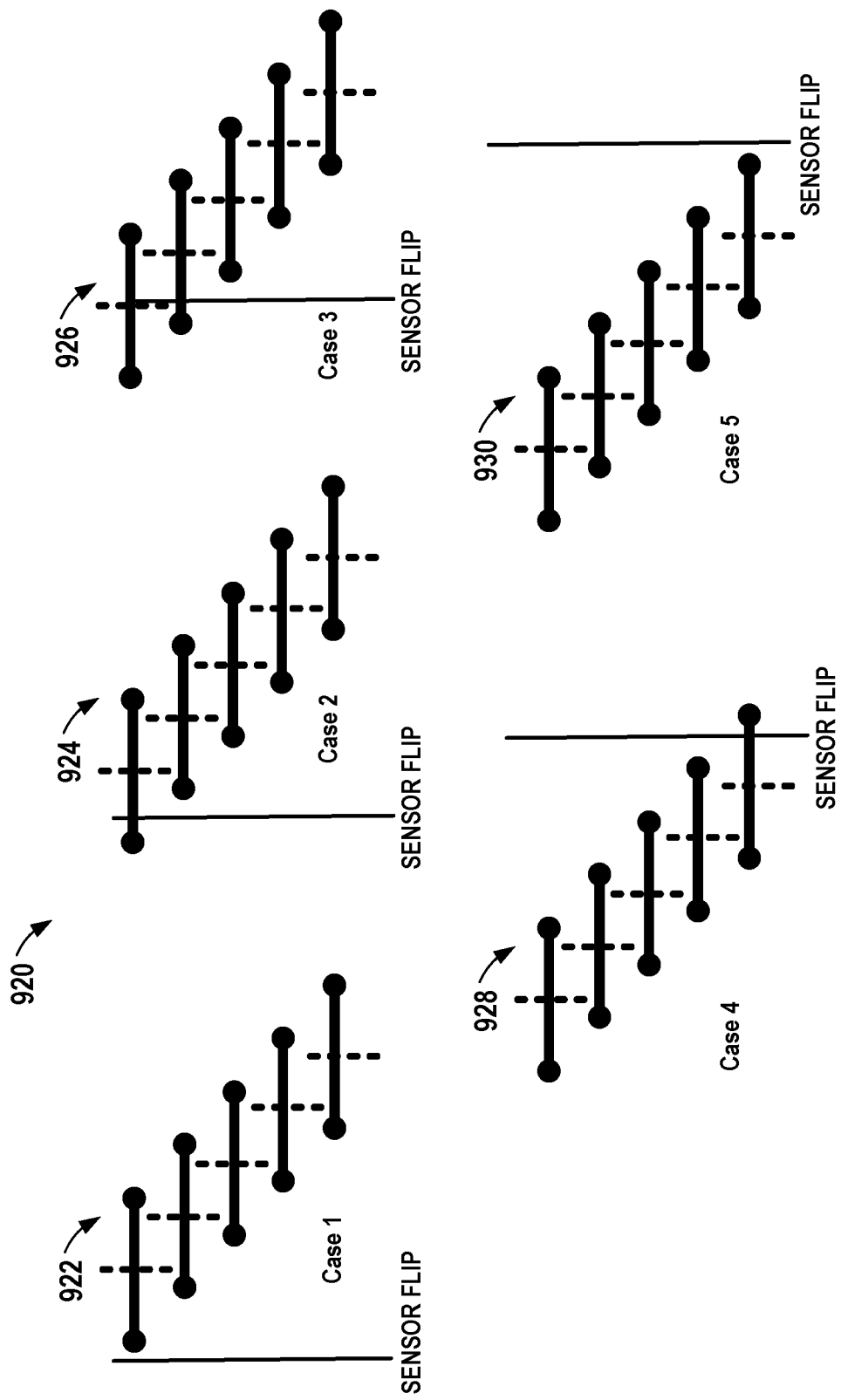

FIG. 9B illustrates multiple example clock skew cases 920 with different example synchronization points SENSOR FLIP for skew adjust control functions 900 of FIG. 9A of one or more disclosed embodiments. As shown, clock skew case 1, 922 includes a synchronization point SENSOR FLIP that occurs before a zero coarse programmable delay COARSE DELAY 0. As shown, clock skew case 2, 924 includes a synchronization point SENSOR FLIP that occurs with a zero coarse programmable delay COARSE DELAY 0. As shown, clock skew case 3, 926 includes a synchronization point SENSOR FLIP that crosses multiple possible coarse delays but the optimal coarse delay is at coarse programmable delay COARSE DELAY 0. As shown, clock skew case 4, 928 includes a synchronization point SENSOR FLIP that occurs with the last coarse programmable delay COARSE DELAY 4. As shown, clock skew case 5, 930 includes a synchronization point SENSOR FLIP that occurs after the coarse programmable delay COARSE DELAY 4, and the synchronization point cannot be reached with any coarse programmable delay.

Figure 10A:
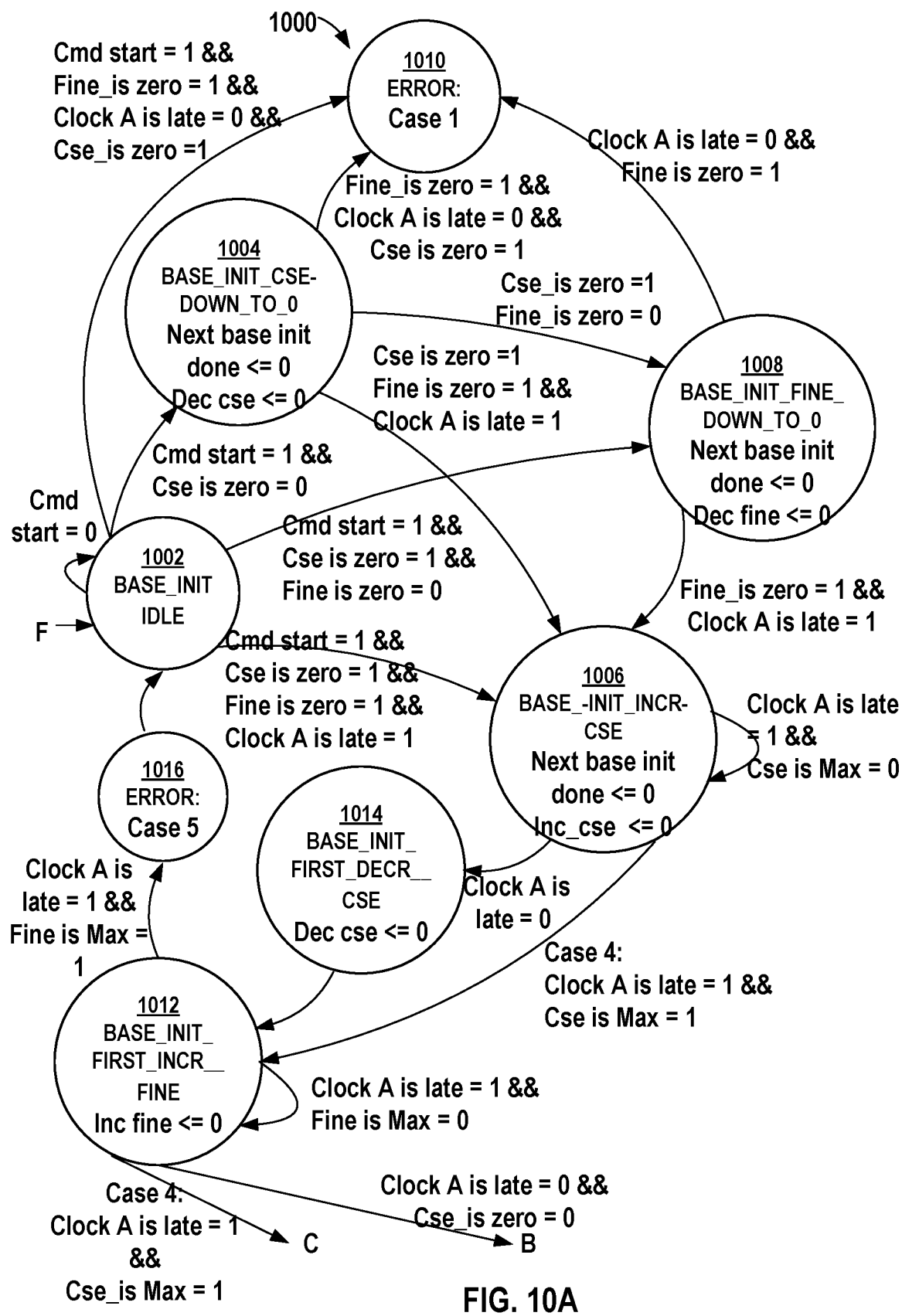
FIGS. 10A, and 10B together provide a diagram illustrating example state machine operations for the examples clock skew cases of FIGS. 9A and 9B for implementing skew adjust control of one or more disclosed embodiments.
Figure 10B:
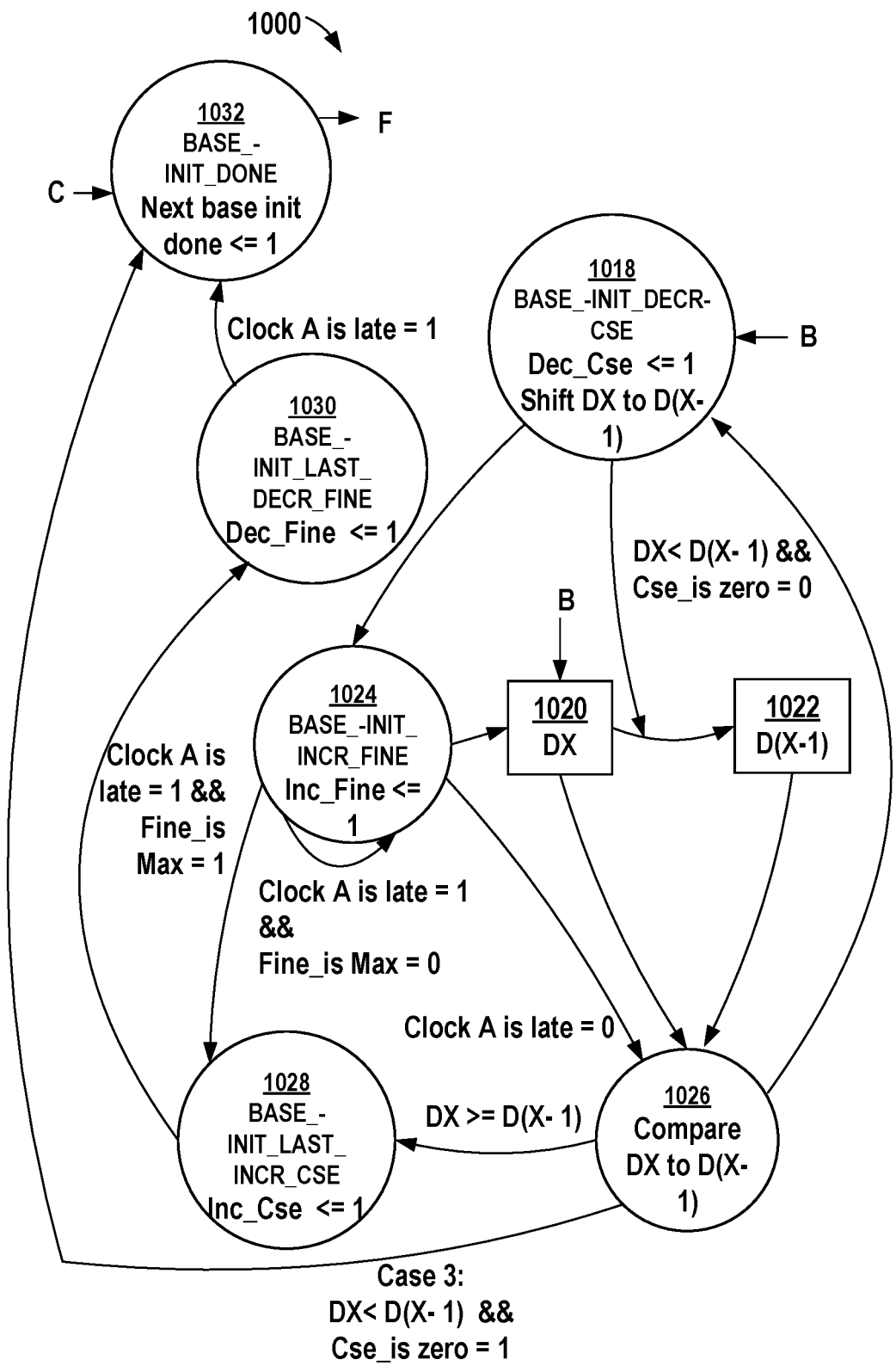

FIGS. 10A and 10B together illustrate example state machine operations 1000 for implementing skew adjust control of an initial adjustment mode to identify an optimal coarse delay setting of one or more disclosed embodiments. The illustrated state machine operations 1000 can be implemented by system 200 with the skew adjust control function 208 of disclosed embodiments in conjunction with the Skew Adjust Control Component 182 and computer 101 of FIG. 1 of disclosed embodiments. The illustrated state machine operations 1000 reference the examples cases 920 as shown in FIGS. 9A and 9B.

In FIG. 10A, state machine operations 1000 can start at a step 1002 Base Init Idle with an initial command (Cmd) start=0. Step 1002, at line Cmd start=1 and coarse (Cse) is zero=0, transitions to a step 1004 Base Init Cse down to 0, with next base init done<=0 and Dec cse<=0 (decreases coarse delay). Step 1004, at line Cse is zero=1, Fine is zero=1 && Clock A is late=1, transitions to a next step 1006 Base Init Incr Cse (Clock A is late=0 && Cse is zero=1), with Next base init done<=0 and Inc cse<=0, (increase coarse delay). Step 1002, at line Cmd start=1 && Cse is zero=1 && Fine is zero=1 && Clock A is late=1, transitions to a step 1006. Step 1004, at line Cse is zero=1, Fine is zero=0, transitions to a next step 1008 Base Init Fine down to 0, with next base init done<=0 and Dec fine<=0 (decrease fine delay). Step 1004, at line Fine is zero=1, Clock A is late=0 && Cse is zero=1, transitions to an error step 1010 indicating fail, such as block 606 in FIG. 6A, or block 806 in FIG. 8A. Step 1002, at line Cmd start=1, Fine is zero=1, Clock A is late=0 && Cse is zero=1, transitions to error step 1010, such as for Case 1 922 of FIG. 9B.

Step 1002 at line Cmd start=1 && Cse is zero=1 && Fine is zero=0, transitions to the step 1008 to decrease fine delay. Step 1008, at line Fine is zero=1 && Clock A is late=1, transitions to the step 1006 Base Init Incr Cse to increase coarse delay. Step 1006, at line Case 4: Clock A is late=1 && Cse is Max=1, transitions to a step 1012 Base Init First Incr Fine (Clock A is late=1 && Cse is Max=0), with Inc Fine<=0, (increase fine delay). Step 1006, at line Clock A is late=0, transitions to a step 1014 Base Init First Iner Cse with Dec cse<=0 (decrease coarse delay), where Step 1014 transitions to the step 1012.

Step 1012 at line Clock A is late=1 && Fine is Max=1, transitions to a step 1016 error: Case 5, where Error Step 1016 transitions to the step 1002 Base Init Idle. Step 1012 at line Clock A is late=0 && Fine is Max=1, transitions to step 1018 and step 1020 following entry point B in FIG. 10B. Step 1012 at line Case 4: Clock A is late=1 && Cse is Max=1, transitions to step 1032 following entry point C in FIG. 10B.

In FIG. 10B, at step 1018 Base Init Decr Cse with Dec Cse<=1 and Shift DX to D(X−1) shifts values 1020, DX to 1022 D(X−1). In FIG. 10B, DX and D(X−1) are the measured distances of the synchronization point to 50% fine delay, as for example shown in FIG. 9A including D0, D1, and D2. Step 1018 transitions to step 1024 Base Init Incr Fine with Inc Fine<=1 (Clock A is late=1 and Fine is Max=0), shifts values to 1020, DX. Step 1024 at line Clock A is late=0, transitions to step 1026 Compare DX to D(X−1), receiving values from 1020, DX and 1022 D(X−1). Step 1026 at line DX>=D(X−1) transitions to step 1028 Base Init Last Incr Cse with Inc Cse<=1. Step 1026 at line DX<D(X−1) && Cse is zero=0, transitions to the step 1018 to shift Dx to D(X−1). Step 1026 at line Case 3: DX<D(X−1) && Cse is zero=1, transitions to step 1032 Done with Next base init done<=1. Step 1030 Base Init Last Decr Fine with Dec Fine<=1 at line Clock A is late=1, transitions to step 1032 Base Init Done with Next base init done<=1, which transitions to step 1002 following entry point F in FIG. 10A.

Figure 11:
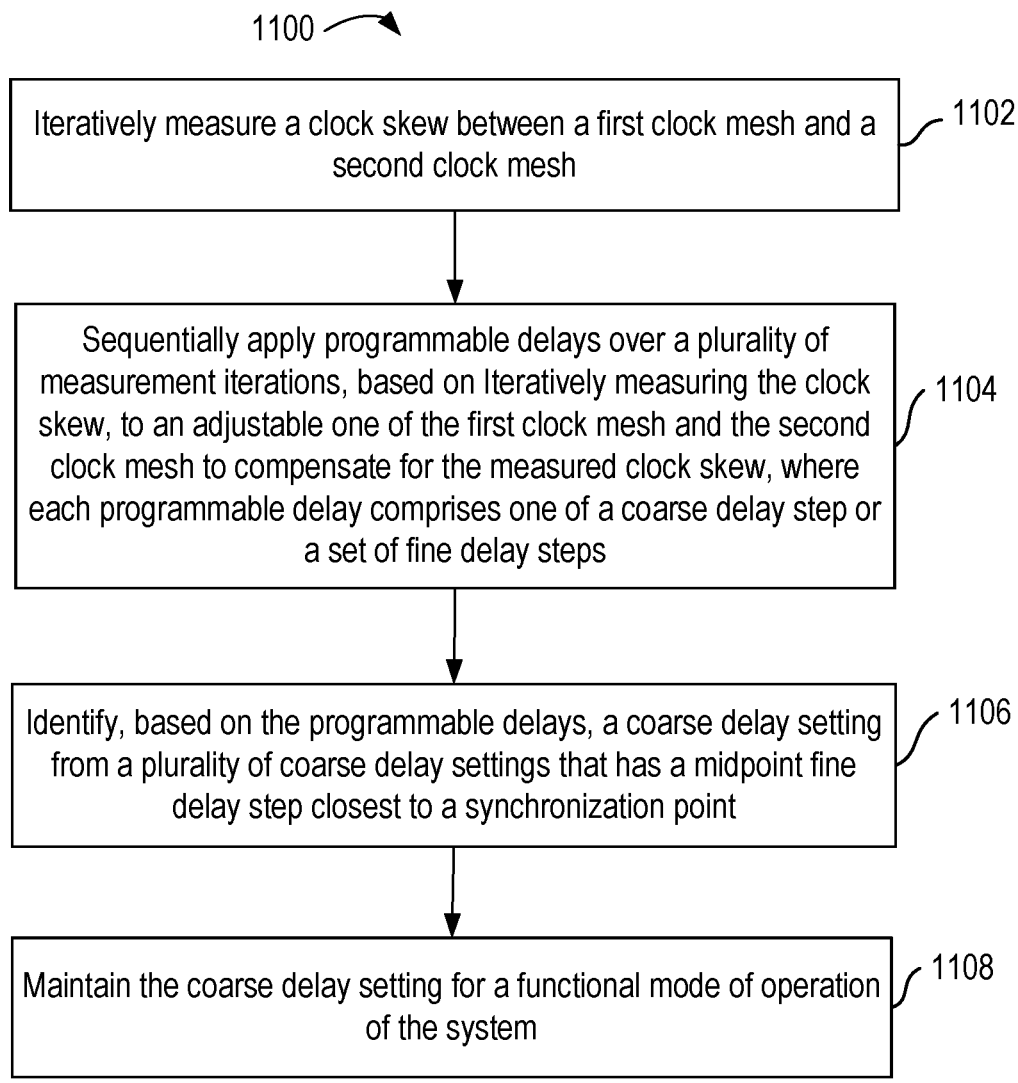
FIG. 11 is a flow chart of an example method for implementing skew adjust control of one or more disclosed embodiments.

FIG. 11 illustrated a method 1100 for implementing skew adjust control of one or more disclosed embodiments. Method 1100 can be implemented by system 200 in conjunction with the Skew Adjust Control Component 182 and computer 101 of FIG. 1 of disclosed embodiments. Method 1100 includes operations and features of the operations of skew adjust control functions 500 and 520 of FIGS. 5A and 5B, method 600 of FIGS. 6A, 6B and 6C, method 800 of FIGS. 8A, and 8B, state machine operations 1000 of FIGS. 10A and 10B.

At block 1102, system 200 iteratively measures a clock skew between a first clock mesh and a second clock mesh of a system. At block 1104, system 200 sequentially applies programmable delays over a plurality of measurement iterations, based on iteratively measuring the clock skew, to an adjustable one of the first clock mesh and the second clock mesh, where each respective programmable delay comprises one of a coarse delay step or a set of fine delay steps to compensate for the measured clock skew. At block 1106, system 200 identifies, based on the programmable delays, a coarse delay setting from a plurality of coarse delay settings that has a midpoint fine delay step closest to a synchronization point. At block 1108, system 200 maintains the one coarse delay for a functional mode of operation of the system.

While the foregoing is directed to embodiments of the present invention, other and further embodiments of the invention may be devised without departing from the basic scope thereof, and the scope thereof is determined by the claims that follow.

What is claimed is:

1. A method comprising:
   iteratively measuring a clock skew between a first clock mesh and a second clock mesh of a system;
   sequentially applying programmable delays over a plurality of measurement iterations, based on iteratively measuring the clock skew, to an adjustable one of the first clock mesh and the second clock mesh, wherein the respective programmable delay per measurement iteration comprise one of a coarse delay step or a set of fine delay steps to compensate for the measured clock skew;
   identifying, based on the programmable delays, a coarse delay setting from a plurality of coarse delay settings that has a midpoint fine delay step closest to a synchronization point; and
   maintaining the coarse delay setting for a functional mode of operation the system.

2. The method of claim 1, wherein the programmable delay of the coarse delay step per measurement iteration is greater than the programmable delay of a fine delay step of the set of the fine delay steps, and wherein the set of the fine delay steps provide a variable programmable delay per measurement iteration based on iteratively measuring the clock skew.

3. The method of claim 1, wherein only the adjustable one of the first clock mesh and the second clock mesh is delayed, and the other one of the first clock mesh and the second clock mesh is fixed.

4. The method of claim 1, wherein only one single coarse step is applied per measurement iteration to the adjustable one of the first clock mesh and the second clock mesh.

5. The method of claim 1, wherein the set of the fine delay steps applied per measurement iteration increases or decreases the clock skew based on iteratively measuring the clock skew.

6. The method of claim 1, wherein the coarse step applied per measurement iteration increases or decreases the clock skew based on iteratively measuring the clock skew.

7. The method of claim 1, wherein the functional mode of operation of the system further comprises repeatedly measuring the clock skew between the first clock mesh and the second clock mesh; and applying a set of fine delay steps, based on the measured clock skew, to the adjustable one of the first clock mesh and the second clock mesh to synchronize clock signals of the first clock mesh and second clock mesh, wherein the coarse delay setting for the functional mode of operation is unchanged.

8. The method of claim 7, wherein applying the set of fine delay steps further comprises sequentially applying single pico-seconds (pSec) delay steps over a range of 20 pSec and 30 pSec.

9. The method of claim 7, wherein applying the set of fine delay steps increases or decreases the clock skew based on the measured clock skew.

10. The method of claim 1, wherein iteratively measuring the clock skew between the first clock mesh and the second clock mesh of a system further comprises measuring a clock signal level of one or zero of the adjustable clock mesh at a clock signal edge of the other clock mesh.

11. A system, comprising:
    a skew sensor receiving clock signal inputs from an adjustable first clock mesh and a fixed second clock mesh, the skew sensor is operable for iteratively measuring a clock skew between the adjustable first clock mesh and the second fixed clock mesh and providing iteratively sensed skew signals;
    a skew adjust function coupled to the skew sensor receiving the iteratively sensed skew signals, and skew adjust function is operable for sequentially applying programmable delays over a plurality of measurement iterations, based on iteratively measuring the clock skew, to an adjustable one of the first clock mesh and the second clock mesh, wherein the respective programmable delays comprise one of a coarse delay step or a set of fine delay steps to compensate for the measured clock skew; and
    the skew adjust function is operable for identifying, based on the programmable delays, a coarse delay setting from a plurality of coarse delay settings that has a midpoint fine delay step closest to a synchronization point; and maintaining the coarse delay setting for a functional mode of operation of the system.

12. The system of claim 11, wherein only the adjustable one of the first clock mesh and the second clock mesh is delayed, and the other one of the first clock mesh and the second clock mesh is fixed.

13. The system of claim 11, wherein only one single coarse step is applied per measurement iteration to the adjustable one of the first clock mesh and the second clock mesh.

14. The system of claim 11, wherein the set of the fine delay steps per measurement iteration increases or decreases the clock skew based on the measured clock skew.

15. The system of claim 11, wherein the coarse step per measurement iteration increases or decreases the clock skew based on the measured clock skew.

16. A skew adjust control comprising:
    a skew sensor receiving clock signal inputs from an adjustable first clock mesh and a fixed second clock mesh of a system, the skew sensor is operable for iteratively measuring a clock skew between a first clock mesh and a second clock mesh of a system, and providing iteratively sensed skew signals;
    a skew adjust function coupled to the skew sensor receiving the iteratively sensed skew signals, and skew adjust function is operable for sequentially applying programmable delays over a plurality of measurement iterations, based on iteratively measuring the clock skew, to an adjustable one of the first clock mesh and the second clock mesh, wherein the respective programmable delays comprise one of a coarse delay step or a set of fine delay steps to compensate for the measured clock skew; and
    the skew adjust function is operable for identifying, based on the programmable delays, a coarse delay setting from a plurality of coarse delay settings that has a midpoint fine delay step closest to a synchronization point; and for maintaining the coarse delay setting for a functional mode of operation of the system.

17. The skew adjust control of claim 16, wherein the skew sensor further comprises a phase detector receiving the clock signal inputs from the adjustable first clock mesh and the fixed second clock mesh and providing a detected phase output, and a synchronizer receiving inputs of a reference clock and the detected phase output of the phase detector, and providing the iteratively sensed skew signals.

18. The skew adjust control of claim 17, wherein the phase detector comprises a flip-flop and the synchronizer comprises a plurality of pipeline latches.

19. The skew adjust control of claim 16, wherein the skew adjust function identifies the one coarse delay setting to maintain for the functional mode of operation during a base adjustment mode of the system, and wherein the one coarse delay setting comprises an optimal coarse delay for the functional mode of operation of the system.

20. The skew adjust control of claim 19, wherein the skew adjust function is operable for applying only fine delay steps, based on the measured clock skew, to synchronize the first clock mesh and the second clock mesh during the functional mode of operation of the system.

* * * * *